United States Patent
Kawakami et al.

(10) Patent No.: US 7,910,287 B2
(45) Date of Patent: *Mar. 22, 2011

(54) RELIEF PRINTING PLATE, AND METHOD FOR MANUFACTURING ELECTRONIC CIRCUIT PATTERN, ORGANIC ELECTROLUMINESCENCE DEVICE AND ORGANIC ELECTRONIC DEVICE BY USING THE SAME

(75) Inventors: Hironori Kawakami, Tokyo (JP); Koji Takeshita, Tokyo (JP); Takahisa Shimizu, Tokyo (JP); Nahoko Inokuchi, Tokyo (JP); Kazunobu Irie, Tokyo (JP)

(73) Assignee: Toppan Printing Co., Ltd. (JP)

( * ) Notice: Subject to any disclaimer, the term of this patent is extended or adjusted under 35 U.S.C. 154(b) by 501 days.

This patent is subject to a terminal disclaimer.

(21) Appl. No.: 12/069,848

(22) Filed: Feb. 12, 2008

(65) Prior Publication Data
US 2008/0206673 A1 Aug. 28, 2008

(30) Foreign Application Priority Data

Feb. 14, 2007 (JP) ................. 2007-033337
Mar. 19, 2007 (JP) ................. 2007-070261

(51) Int. Cl.
*G03F 7/00* (2006.01)
*G03F 7/26* (2006.01)
(52) U.S. Cl. ............... 430/306; 430/270.1; 430/275.1; 430/319
(58) Field of Classification Search .......... 430/306, 430/319
See application file for complete search history.

(56) References Cited

U.S. PATENT DOCUMENTS

| | | | |
|---|---|---|---|
| 5,780,200 A * | 7/1998 | Kitaguchi et al. | 430/270.1 |
| 7,422,840 B2 * | 9/2008 | Dudek et al. | 430/302 |
| 2003/0082482 A1 * | 5/2003 | Wada et al. | 430/273.1 |
| 2007/0071884 A1 * | 3/2007 | Takeshita et al. | 427/66 |
| 2009/0042138 A1 * | 2/2009 | Roberts et al. | 430/300 |
| 2010/0165823 A1 * | 7/2010 | Wakabayashi et al. | 369/116 |

FOREIGN PATENT DOCUMENTS

| | | |
|---|---|---|
| JP | 10-012377 | 1/1998 |
| JP | 2002-305077 | 10/1998 |
| JP | 2001-093668 | 4/2001 |
| JP | 2001-155858 | 6/2001 |
| JP | 2004-070231 | 3/2004 |

OTHER PUBLICATIONS

Spectra (2010).*
C.W. Tang and S.A. Vanslyke, "Organic Electroluminescent Diodes", Appl. Phys. Lett. 51 (12), Sep. 21, 1987.

* cited by examiner

*Primary Examiner* — Cynthia H Kelly
*Assistant Examiner* — Chanceity N Robinson
(74) *Attorney, Agent, or Firm* — Squire, Sanders & Dempsey (US) LLP

(57) ABSTRACT

An embodiment of the present invention is a relief printing plate for forming a high-definition pattern by a printing method, having a convex part comprising a resin layer, a base material supporting the convex part and a light reflection controlling layer, the light wave length being in range of 400 nm-800 nm, and the layer being between the convex part and the base material.

5 Claims, 13 Drawing Sheets (a)

RELIEF PRINTING PLATE, AND METHOD FOR MANUFACTURING ELECTRONIC CIRCUIT PATTERN, ORGANIC ELECTROLUMINESCENCE DEVICE AND ORGANIC ELECTRONIC DEVICE BY USING THE SAME

CROSS REFERENCE

This application claims priority to Japanese application number 2007-033337, filed on Feb. 14, 2007, and priority to Japanese application number 2007-070261, filed on Mar. 19, 2007, which are incorporated by references.

BACKGROUND OF THE INVENTION

1. Field of the Invention

The present invention is related to the following products or methods:
(A) a relief printing plate for forming a high definition pattern by a printing method;
(B) a plate type photosensitive resin for manufacture the relief printing plate;
(C) a method for manufacturing an electric circuit pattern formed using the relief printing plate;
(D) a method for manufacturing an organic electroluminescence (EL) device;
(E) an organic EL device; and
(F) an organic EL display.

In addition, the present invention is related to the following products or methods:
(G) a relief printing plate used for manufacturing an organic electronic device;
(H) an inspection method of the relief printing plate;
(I) a method for manufacturing the organic electronic device by using the relief printing plate; and
(J) an organic electronic device.

2. Description of the Related Art

In recent years, development of electronic devices using a fine processing technique is remarkable. It is expected that such a electronic device will contribute to development in a electronics field, biotechnology field and an optronics field of the next generation.

In these days, electronic devices in practical use are mainly manufactured using inorganic semiconductors. However, hereafter, in view of reduction of manufacturing cost, power consumption of a device and higher performance of a device, it has been expected that organic electronic devices will be in practical use, the organic electronic device using a material having a property different from a property of a conventional material or especially using an organic molecule.

Among them, an organic electronic device which functions as a light emitting device is especially called an organic electroluminescence device. Especially, the organic electroluminescence device attracts attention in view of a thin device, low power consumption and light emitting characteristics.

The organic electroluminescence (EL) device is a light emitting device having an organic light emitting layer between an anode and a cathode. When a voltage is applied to the EL device, a hole is injected from an anode and an electron is injected from a cathode. When a pair of the hole and the electron recombines in a surface or an inside of the organic light emitting layer, energy is generated. The energy is taken out as light. The organic EL device in which an organic material is used for a light emitting layer has been studied from a long time ago. Since there was a problem in a light emitting efficiency, the organic EL device was not in practical use. However, C. W. Tang was proposed an organic EL device having two layer construction where an organic layer was divided into two layers of a light emitting layer and a hole transport layer. In this organic EL device, it was confirmed that light was high efficiently emitted at low voltage (See non-patent document 1). Therefore, from this time, the organic EL device has been actively studied.

An organic EL element emits light when a current is supplied to a light emitting layer which is formed from an organic light emitting material and between two opposed electrodes, and, in order to achieve efficient light emission, it is important to keep a film thickness of the light emitting layer to about 100 nm. Further, in the case of forming a display from the organic EL element, it is necessary to perform patterning on the organic EL element with high definition.

As the organic light emitting material for forming the light emitting layer, a low molecular material and a high molecular material are usable. The low molecular material is subjected to resistive heating vapor deposition and the like to form a thin film, and at the same time the patterning is performed by using a microscopically patterned mask. However, this method has a problem that patterning accuracy is reduced with an increase in size of a substrate.

That is, when patterning of a light emitting layer is performed in order to make an organic EL device full-colored, in the case where a low molecular material is used, light emitting materials of different light emitting colors is evaporated and formed on parts corresponding to desirable pixels by using a mask having patterns corresponding to desirable pixel shape. This method is superior in forming evenly a thin film of a desirable shape. However, in view of accuracy of a mask, if a substrate to be evaporated is large, it is difficult to form a pattern.

On the other hand, in the case where a high molecular material is used, pattern formation by an ink jet method and pattern formation by a printing method are mainly proposed. For example, an ink jet method disclosed in a patent document 1 is a method for forming a desired pattern by a step of discharging a light emitting material, the material being dissolved in a solvent, on a substrate from an ink jet nozzle and a step of drying the discharged material.

However, since an ink droplet discharged from a nozzle is spherical, when the ink droplet drops on a substrate, the ink spreads to circular shaped. Therefore, the shape of formed pattern lacks in linearity. In other case, since accuracy in dropping of an ink droplet is bad, there is a problem in than a linear pattern can not obtained. On the other hand, for example, in patent document 2, a method for form a linear pattern by the following processes is disclosed: a bank having an ink-repellent property is formed on a substrate by a photolithography method or the like; thereafter, an ink droplet is dropped there and the ink is repelled according to a shape of a bank; and a linear pattern is formed. However, when the repelled ink goes back inside a pixel, an ink is built up, thereby there is a remained problem in that a fluctuation of film thickness of an organic light emitting layer inside a pixel occurs.

Therefore, the high molecular material has recently been used as the organic light emitting material, and a method of forming a thin film by wet coating with a coating liquid obtained by dispersing or dissolving the organic light emitting material into a solvent has been tried. As the wet coating method for the thin film formation, spin coating, bar coating, projection coating, dip coating, and the like are known. However, the wet coating methods have difficulty in realizing the high definition patterning and color coding with R, G, and B, and it is considered that the thin film is most effectively formed by a printing process that is capable of achieving excellent color coding and patterning.

Then, an ink is made by using an organic high molecular light emitting material, instead of a low molecular organic light emitting material. A method for forming a pattern by a printing method using this ink has been proposed. In particular, a method using a resin relief printing plate, a method using a reverse type printing and a method using a screen printing has been proposed.

It is often that an organic electroluminescence element or a display uses a glass substrate as a substrate. Thus, a method to use metal hard printing plate such as a gravure printing method is unsuitable. Offset printing to use rubber blanket having elasticity and relief printing method to use rubber printing plate and photosensitive resin printing plate having elasticity are suitable. As attempt by these printing methods, a method (patent document 3) by offset printing and a method (patent document 4) by relief printing are really proposed.

Especially, a printing method using a resin relief printing plate is superior in accuracy of pattern formation and evenness of a film thickness, thereby the printing method is suitable for a method for manufacturing an organic EL device by a printing method. In addition, if a low molecule organic light emitting material can be dissolved or dispersed in a solvent, not only a high molecule organic light emitting material but also a low molecule organic light emitting material can be used for making an ink and pattern formation by a printing method using the ink is possible.

In general, in the case where a display device using an organic electroluminescence device is used, it is often that a matrix display is formed by sectioning a light emitting part into a fine pixel. When such a matrix display is manufactured by a printing method, a relief printing plate which is patterned as a delta shape or a stripe shape, the shape being corresponding to a shape of a pixel, is used. In this case, if a relief printing plate has a defect, a pattern printed on a substrate by using this relief printing plate also has a defect. This causes a defective device. In a display device, checking by comparison of patterns by an optical checking is generally performed for checking if a defect in a pattern exists or not. In this method, a matrix pattern image formed on a substrate while transmittance light or reflection light is irradiated is taken by a line sensor or an area sensor. In each pixel of a matrix, a pixel is compared with an adjacent pixel if a pattern of the pixel is same or not. If shapes of the patterns are same, the test result is good. If shapes of the patterns are different, it is thought that a defect such as an included undesirable material or a void in a pixel occurs.

However, in the case where this checking method is applied to a pattern formed substrate of an organic electroluminescence device, an organic light emitting layer or an organic light emitting assist layer formed on a substrate is irradiated with strong light. In general, an organic light emitting layer used for an organic electroluminescence device is weak for strong light. The characteristics of the organic electroluminescence device may become bad by irradiation light at the time of the checking. In addition, if the characteristics do not become bad, it is difficult to check the device because it is difficult to obtain sufficient contrast at the time of optical checking. This is because film thicknesses of an organic light emitting layer and an organic light emitting assist layer are thin, about several tens nm, thereby absorption of light at the layers is small. Therefore, it is important to perform optical checking of a relief printing plate used for forming a pattern.

On the other hand, in the structure of a relief printing plate used for forming a pattern of an organic electroluminescence, it is desirable that a metal material be used for a base material in view of position accuracy of a pattern of a relief printing plate as shown in a patent document 5 by the inventor of the present invention. In addition, it is desirable that a convex part of a relief printing plate, the part being formed on a base material, be formed of a resin such as a resin shown in a patent document 6 and a patent document 7 by the inventor of the present invention. According to these inventions, since a relief printing plate has a metal substrate and a resin relief printing layer on the metal substrate, it is necessary for the pattern of the resin relief printing layer on the metal substrate to be checked if the pattern has a defect or not. However, in the case where the defect check is performed for a fine pattern on a metal substrate by a comparison checking, it is difficult to recognize a defect. This is because diffusely reflection from a surface of a metal under the resin pattern is stronger than an image contrast obtained by the resin pattern.

Hereinafter, the known documents are described.

[non-patent document] C. W. Tang, S. A. VanSlyke, Applied Physics Letters, vol. 51, p. 913 (1987)

[patent document 1] JP-A-H10-12377
[patent document 2] JP-A-2002-305077
[patent document 3] JP-A-2001-93668
[patent document 4] JP-A-2001-155858
[patent document 5] Japanese Patent Application No. 2006-179160
[patent document 6] Japanese Patent Application No. 2006-268872
[patent document 7] Japanese Patent Application No. 2006-268873
[patent document 8] JP-A-2004-70231

SUMMARY OF THE INVENTION

One embodiment of the present invention is a relief printing plate for forming a high-definition pattern by a printing method, comprising: a convex part comprising a resin layer; a base material supporting the convex part; and a light reflection controlling layer, the layer having a function of light reflection controlling performance in white light in the wave length range of 400 nm-800 nm, and the layer being between the convex part and the base material.

Figure 1:
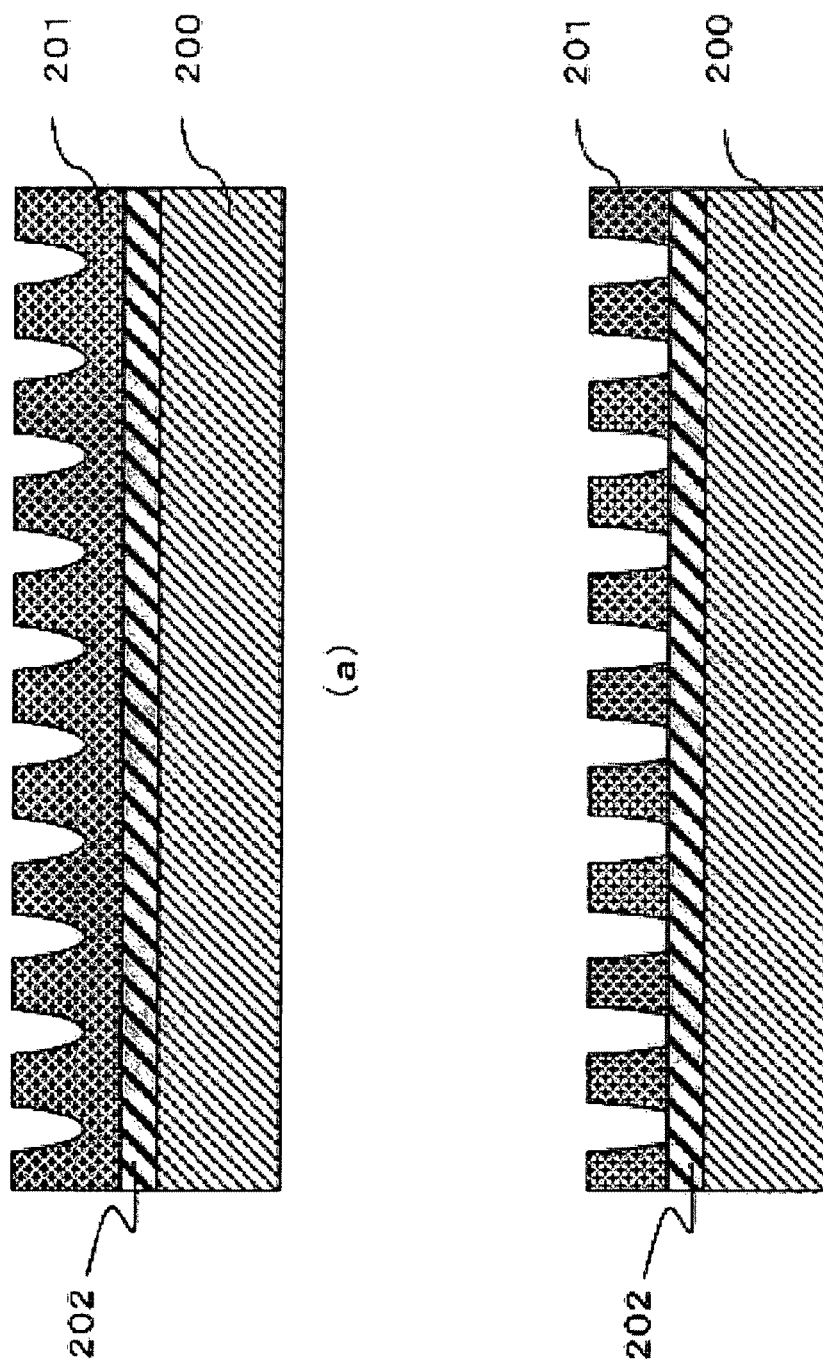
FIGS. 1 (a) and (b) are explanatory cross-sectional diagram of one example of a relief printing plate of the present invention.

In these drawings, 1 is a substrate; 2 is a first electrode; 3 is a hole transport layer; 41 is a red organic light emitting layer; 42 is a green organic light emitting layer; 43 is a blue organic light emitting layer; 5 is a second electrode; 7 is a partition wall; 8 is a glass cap; 9 is an adhesive; 101 is an ink replenishing device; 102 is a doctor; 103 is an anilox roll; 104 is a relief printing plate; 105 is a plate cylinder; 106 is a substrate to be printed; 107 is a stage; 108 is an ink; 108a is an ink pattern; 111 is a support medium; 112 is an active layer; 113 is a gate insulator; 114 is a gate electrode; 116 is a drain electrode; 117 is a planarizing layer; 118 is a contact hole; 120 is a TFT; 200 is a base material; 201 is a convex pattern; 201' is a photosensitive resin composition; 202 is a reflection preventing layer (a light reflection controlling layer); 203 is a laminated body; 204 is a laminated body; 31 is a sealing glass; 32 is a cathode; 33 is a light emitting layer; 34 is a hole transport layer; 35 is an anode; 36 is a substrate; 37 is an insulating layer; 38 is an adhesive; 310 is an ink tank; 312 is an ink chamber; 314 is an anilox roll; 316 is a resin relief printing plate; 318 is a plate cylinder; 324 is a substrate to be printed; 3101 is a metal substrate; 3102 is an adhesive layer; 3103 is a convex pattern part; 3201 is a defect of a pattern; 3202 is an inspection light; 3301 is a light absorption layer; 3401 is a light absorption property relief printing plate; and 3501 is a light absorption layer.

DETAILED DESCRIPTION OF THE INVENTION

In general, as for the size of an electric circuit pattern of an electronic device, it is several mm-several nm.

For example, in the case of organic EL display, in a display (QVGA) of 320 pixels×240 pixels and of diagonal size of 2 inches, the display being becoming a main stream for a main display of a mobile phone, it is necessary for a pixel size to be 120 µm and it is necessary for a width of a display part per one color to be 20-40 µm. That is, high definition pattern is needed.

In the case where respective layers such as a hole transport layer, a light emitting layer, a electron transport layer and a cathode, the layers being for an organic EL display, are formed on a substrate (TFT substrate) having an electric circuit using a thin film transistor (TFT) with a transparent electrode, the display is a high definition organic EL display called an active matrix type. In addition, TFT electric circuit used herein is made from high definition (several µm) electric circuit pattern.

In the case where such a high definition pattern, for example an organic EL display, is formed, a desirable pattern accuracy such as a total pitch accuracy or a line width accuracy, the accuracy being demanded for forming a thin film on an electric circuit pattern, is generally ±5% or less. As absolute value, accuracy of about 0.1 µm-2 µm is needed.

In the case where control of a high definition pattern such an usual electric circuit is performed, a length is generally measured by a method called a edge detection method. In this method, various light sources such as a reflection light, a coaxial vertical light and a transmitted light is used. An object is transformed to a digital image by an image input apparatus such as a CCD camera. An edge of pattern is recognized according to contrast of an image. Thereby, a high definition control which is not easy to be changed according to a measuring person is possible.

On the other hand, in the case where a printed matter such as an advertisement or a magazine is printed, accuracy of a pattern changes drastically according to a formed pattern. For example, it is ±10% or more. As an absolute value, it is often that it is 10 µm-100 µm.

It is often that confirming of accuracy of a pattern of a printing plate for forming these printed matter is performed by the naked eyes or by human eyes through a microscope. However, in these methods, the measured date often depends on a measuring person. However, in view of accuracy needed for a object to be printed, this method for controlling a printing plate is sufficient.

On the other hand, in the case of a printing plate used for forming a high definition pattern such as an organic EL display, demanded accuracy is about 0.1 µm-2 µm as mentioned above. Therefore, it is impossible to obtain sufficient measuring accuracy by human eye through a microscope and measuring the length.

However, in the case where the above-mentioned edge detection method is used, especially in the case where a metal plate is used as a base material for the purpose of achieving a dimension stability, it is impossible to detect a precise edge of a convex part of a printing plate due to influence of diffusely reflection at this metal layer. It is impossible to precisely evaluate a width of a line and to stably control a printing plate.

According to the present invention, even if a base material having a high reflectance such as a metal base material is use for a relief printing plate, it is possible to precisely to detect a edge of printing material. Therefore, stable control of high definition printing plate is possible.

In addition, the present invention is to provide a relief printing plate without a defect, a checking method which is beforehand performed to prevent a pattern defect, a method for manufacturing an organic electronic device using the same and an organic electronic device using the same, in the case where an organic electronic device such as an organic electroluminescence device is manufactured by a relief printing plate.

Hereinafter, embodiments of the present invention are described referring to figures. In addition, the present invention is not limited to these embodiments.

FIG. 1 shows an explanatory cross-sectional diagram of an example of a relief printing plate of the present invention. In FIGS. 1 (a) and (b), a reflection preventing layer 202 and convex pattern 201 comprised of a resin layer are formed on a base material (a substrate) 200. In FIG. 1 (a), convex patterns are formed on the substrate so that the convex patterns are continuously connected to the adjacent convex patterns. In FIG. 1(b), the convex patterns are formed on the substrate so that the convex patterns are not, independently, connected to the adjacent patterns. In the present invention, both types shown in Figs. (a) and (b) can be used. In addition, a layer having the following function can be added between the resin layer and the base material layer as needed: UV ray reflection preventing property; water-resistant property; oil-resistant property; and adhesion property.

In a plate material used for a relief printing plate of the present invention, those having mechanical strength sufficient for printing are used, and examples thereof include a known synthetic resin such as polyethylene, polystyrene, polybutadiene, polyvinyl chloride, polyvinylidene chloride, polyvinyl acetate, polyamide, polyethersulfone, polyethylenetelephthalate, polyethylenenaphthalate, polyethersulfone, and polyvinyl alcohol; a known metal such as iron, copper, and aluminum; or a stacked body thereof.

In addition, it is desirable that a base material having a high dimension stability be used for the base material 200 which is a element of a relief printing plate used for the present invention. Therefore, metals or resins are preferably used for a material for the base material. In the point of dimension accuracy, metals are more preferable. However, metallic luster becomes a problem in the case of checking the printing plate. Examples of metals used as the base material 200 include iron, aluminium, copper, zinc, nickel, titanium, chromium, gold and silver, and an alloy thereof and a stacked body thereof. Especially, in view of processability and economy, a steel base material of which main component is iron and an aluminum base material are suitable.

Examples of polymers which can be one component of the resin used for a convex part of a relief printing plate include rubbers such as butadiene acrylonitrile rubber, silicone rubber, isoprene rubber, styrene-butadiene rubber, butadiene rubber, chloroprene rubber, isobutylene-isoprene rubber, acrylonitrile rubber, ethylene propylene rubber and urethane rubber, and synthetic resins such as polyethylen, polystyrene, polybutadiene, polyvinyl chloride, polyvinylidene chloride, polyvinyl acetate, polyamide, polyurethane, polyethersulfone, polyethylene terephthalate, polyethylenenaphthalate, polyethersulfone, polyvinyl alcohol and copolymer thereof, and natural polymers such as cellulose. One or more kinds of materials among the above-mentioned materials can be selected for the component. However, in the case where a coating liquid such as an organic light emitting material is applied, in view of a solvent resistant property to an organic solvent, fluororesins such as fluorine-containing elastomers, polytetrafluoroethylene, polyvinylidene fluoride, polytetrafluorovinylidene, and copolymers thereof are preferred.

A relief printing plate can have a solvent resistant property if the plate include at least one material which can be dissolved in a water-soluble solvent, examples of the material including polyvinyl alcohol, polyamide, polyurethane, cellulose acetate amber acid ester, partial saponification polyvinyl acetate, cation type piperazine inclusion polyamide and derivatives thereof. Therefore, it is desirable that one or more materials among the above-mentioned materials be used.

As for a light reflection controlling layer, if the layer has a function of light reflection controlling performance in white light in the wave length range of 400 nm-800 nm which is a general wave length range of an observation light of a measuring apparatus, any layer is usable. Both a method of light diffusion and a light absorption may be usable. However, in the case of light diffusion, when an edge is detected, contrast becomes low due to influence of the diffusion light. Therefore, accuracy in measuring tends to be low. From this reason, it is most desirable that a light absorption layer be used for a light reflection controlling layer.

It is thought that a light reflection controlling layer shows various colors such as dark blue, dark green, dark red and dark orange. However, a black layer is most preferred.

As for a light absorption layer used for a light reflection controlling layer, transmittance is 85% or less in visible light in the wave length range of 400 nm-800 nm. In the case of more than 85%, the effect as a light reflection controlling layer is low. Therefore, accuracy of detecting an edge is remarkably reduced due to a reflection light from a base material layer.

It is desirable that a layer thickness of a light reflection controlling layer be 1 nm-50 μm. In the case of 50 μm or more, if a resin type material is coated, a range of unevenness of the film thickness is increased. Thereby, the total thickness of a printing plate is influenced.

It is desirable that a layer thickness of a light reflection controlling layer be 1 nm-5 μm in the case of dry coating. The desirable thickness depends on molar absorption coefficient of a used material or transmittance of a light reflection controlling layer itself in visible light region. However, in the case of a light reflection controlling layer having a main component of an inorganic material, 1 nm-1 μm is desirable. In the case of a light reflection controlling layer having a main component of an organic material including carbon simple substance, 0.5 μm-5 μm is desirable. In the case where the thicknesses are under the respective lower limit values, transmittances are reduced. Thereby, reflection from a base material layer is strongly detected. In addition, in the case where the thicknesses are over the respective upper limit values, the function of a light reflection controlling layer is not a problem while efficiency of utilization of a material is reduced and time for forming a light reflection controlling layer becomes long. Especially, as an example of an inorganic material, in the case of a metal simple substance such as aluminum, it takes longer time for forming a thicker film and a function of a light reflection controlling layer disappears due to a coming up strong metal brilliance.

An organic material, an inorganic material and complex bode thereof can be used for a material of a light reflection controlling layer. In the case where an organic material is used, the material can be applied to the entire surface of a base material by a wet coating method such as a bar coat method, a slit coat method, a spray coat method, a flexo printing and a gravure printing. A known material such as a black oily dye can be used as an organic material. On the other hand, in the case where an inorganic material is used, a dry coating process such as a sputter method, a vacuum evaporation method and a CVD method can be used. A black layer can be formed by depositing a metal simple substance such as Ag or Al to several hundred picometer-several tens nm. In addition, a metal oxide such as chrome oxide can also used.

A convex part using a resin in the present invention can be formed by various pattern forming method such as a photolithography method using a positive type photosensitive resin, a photolithography method using a negative type photosensitive resin, a injection molding method, a relief printing method, a intaglio printing method, a planographic printing method, a stencil printing method and a laser abrasion method. However, in view of high definition of a pattern, a photolithography method using a photosensitive method is preferred. In addition, a photolithography method using a negative type photosensitive resin, the method being able to manufacture a relief printing plate having a demanded accuracy, is most preferable.

In the case where a photolithography method using a photosensitive resin is used for a method for forming a convex pattern, it is most preferable that a convex part of a relief printing plate is formed by using a plate type photosensitive resin laminated body, the body having a base material layer, a reflection controlling layer and a photosensitive resin layer, in this order. Well-known methods such as an injection molding method, a projecting forming method, a laminate method, a bar coat method, a slit coat method and a "KANMA" coat method (See JP-A-2005-338215, column [0053]) can be used for shape forming of a photosensitive resin layer.

Figure 2:
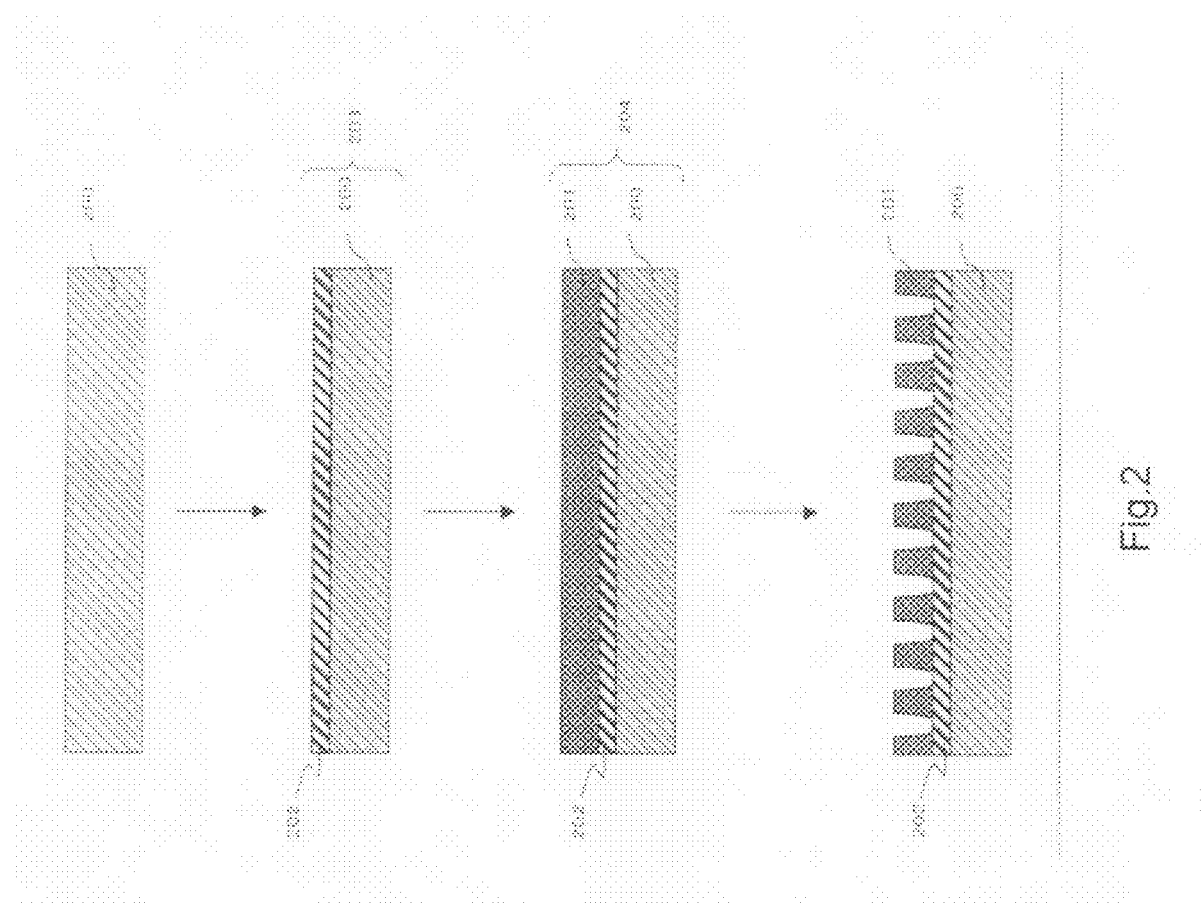
FIG. 2 is an explanatory cross-sectional diagram of a method for forming a plate type photosensitive resin laminated body.

FIG. 2 shows a method for shape forming of a plate type photosensitive resin laminated body. At first, a laminated body 203 is manufactured by forming a reflection controlling layer 202 on a base material 200 by a wet coating process such as a bar coat method, a slit coat method, a spray coat method, a flexo printing and a gravure printing, and a dry coating process such as a sputtering method, a vacuum evaporation method and a CVD method. Next, a laminated body 204 is manufactured by forming a photosensitive resin layer 201' on the laminated body 203 by a well-known method such as an injection molding method, a projection forming method, a laminate method, a bar coat method, a slit coat method and a KANMA coat method. A relief printing plate for forming a high definition pattern is formed through a known exposure and development for this laminated body 204.

Next, a method for manufacturing an organic EL device is described as one example of a method for manufacturing an electric circuit pattern by using the relief printing plate for forming a high definition pattern, the plate being shape formed by the above-mentioned method. In addition, the present invention is not limited to this embodiment.

Figure 3:
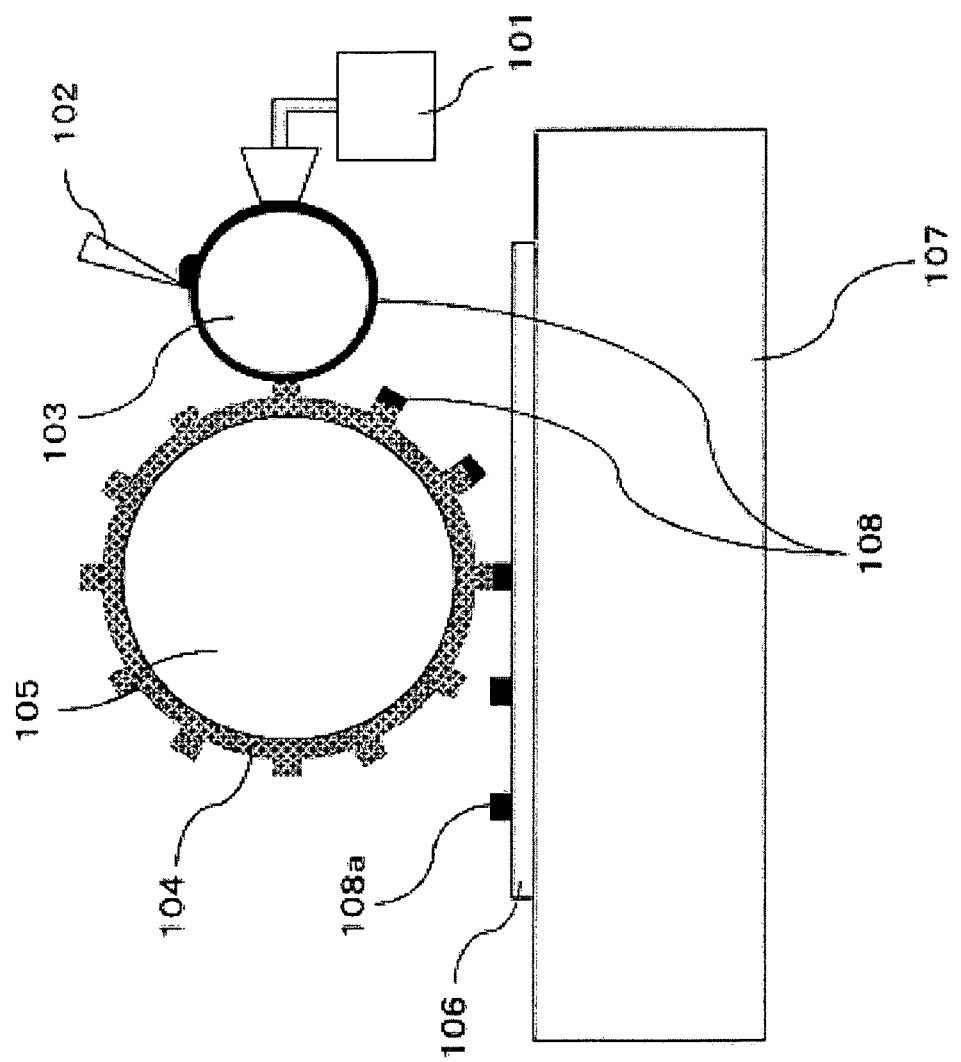
FIG. 3 is a schematic diagram of a relief printing apparatus used for the present invention.

FIG. 3 is a schematic diagram of a relief printing apparatus (machine) used for manufacturing a printed matter of the present invention. A substrate to be printed 106 is fixed on a stage 107. A relief printing plate having a pattern according to the present invention is fixed around a plate cylinder 105. The relief printing plate 104 is in contact with an anilox roll 103. The anilox roll 103 has an ink replenishing device 101 and a doctor 102.

At first, an anilox roll 103 is replenished with an ink from an ink replenishing device. Unnecessary ink of ink 108 supplied to anilox roll 103 is removed by doctor 102. For ink replenishing device 101, ink replenishing device of drip type, fountain roll, coater such as slit coater, die coater or cap coater or combination thereof can be used. For doctor 102, well-known doctor such as a doctor blade or a doctor roll can be used. In addition, for anilox roll 103, an anilox roll made of chromium or ceramics can be used. In addition, a cylinder-shaped anilox roll and flat anilox board can be used. For example, an anilox board is placed at a position of a substrate to be printed 106 in FIG. 3. Whole area of an anilox board is replenished with an ink by an ink replenishing device. Thereafter, by a rotation of printing cylinder, ink can be supplied to the substrate to be printed.

An ink which is uniformly formed by the doctor on a surface of the anilox roll 103, the roll being a ink supplying body to a relief printing plate, is transferred and supplied to a convex pattern of the relief printing plate 104 arranged on a plate cylinder 105. Then, the convex pattern of the relief printing plate 104 moves relatively to a substrate in accordance with rotation of the plate cylinder 105 while the convex pattern is in contact with the substrate. Thereby, an ink 108 is transferred to a predetermined position of the substrate to be printed 106. In this way, an ink pattern 108a is formed on the substrate to be printed. After having formed the ink pattern on the substrate to be printed, drying the ink pattern is performed as needed.

In addition, in the case where an ink on a relief printing plate is printed on a substrate to be printed, the following two types can be adopted: stage 107 on which a substrate to be printed 106 is fixed is moved in accordance with rotation of a plate cylinder 105; and a printing unit including a plate cylinder 105, a relief printing plate 104, an anilox roll 103 and an ink replenishment device 101, shown in upper part of FIG. 3, is moved in accordance with rotation of a plate cylinder. In addition, a relief printing plate of the present invention can be manufactured by forming a resin layer on a plate cylinder 105 and forming a convex pattern by directly shape forming of a printing plate.

In addition, FIG. 3 is a single-substrate processing type relief printing apparatus in which an ink pattern is formed on every substrate. However, in a method for manufacturing a printed matter of the present invention, in the case where a substrate to be printed is a web type and printing is performed by a winding process, so-called "roll-to-roll" type relief printing apparatus can be used. In the case where a roll-to-roll type relief printing apparatus is used, ink patterns can be continuously formed, thereby reduction of manufacturing cost is possible.

Figure 4:
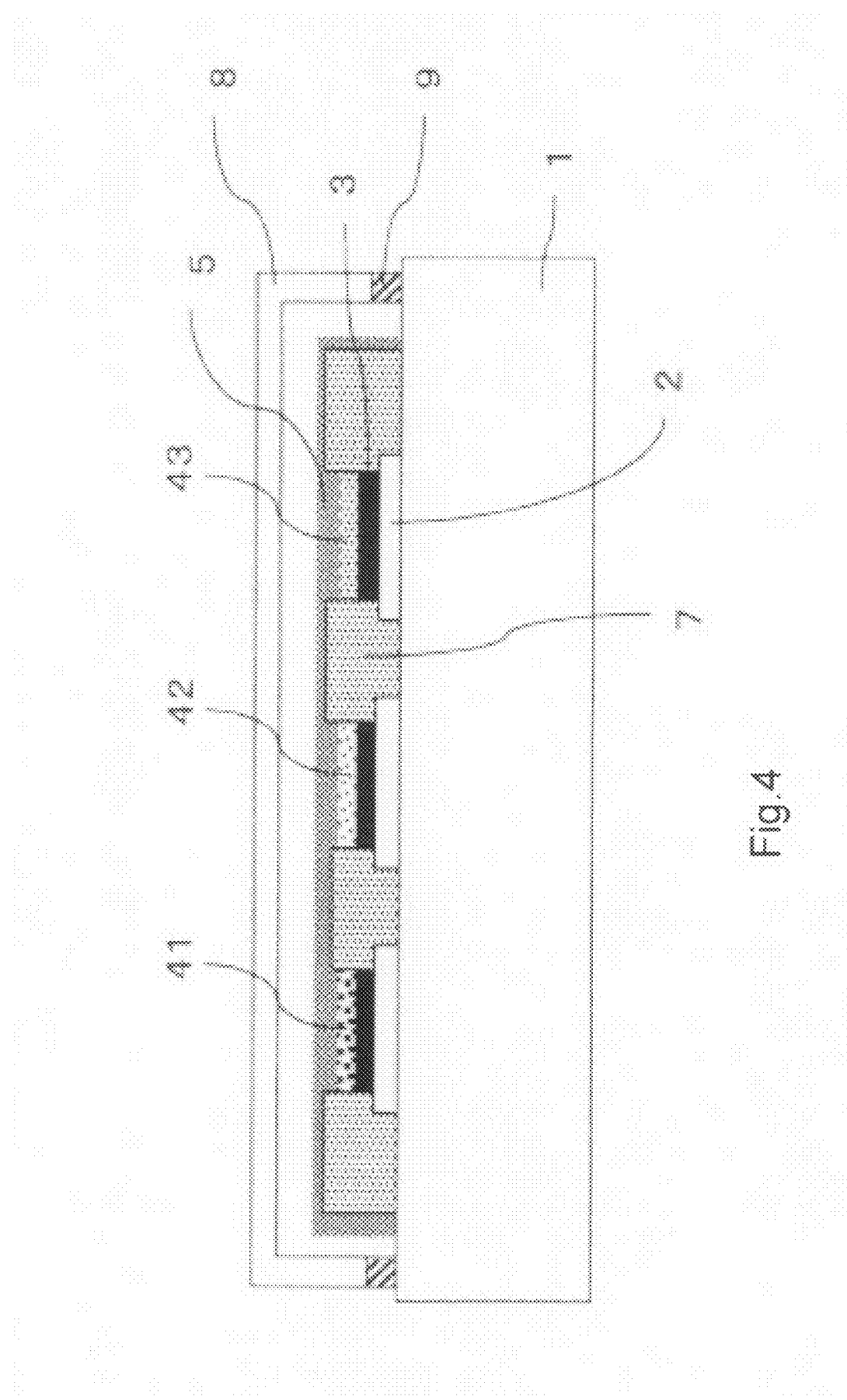
FIG. 4 is an exemplary cross-sectional diagram of one example of an organic EL device of the present invention.

Next, a method for manufacturing an organic EL device is described as one example of a method for manufacturing a printed matter using a relief printing plate in which a pattern is formed according to the present invention. In addition, the present invention is not limited to this embodiment. FIG. 4 shows an explanatory cross-sectional diagram of an organic EL device of the present invention. As methods for driving a organic EL device, there are a passive matrix type and an active matrix type. In an organic EL device of the present invention, both types are suitable.

An organic electroluminescence device of a passive matrix type is an organic electroluminescence element which includes stripe-shaped electrodes that are opposed to with perpendicular state. It emits light at the intersection point. On the other hand, an active matrix type has a so-called thin film transistor (TFT) substrate. Transistor is formed in each pixel. In active matrix type, light is emitted in each pixel independently.

As shown in FIG. 4, an organic electroluminescence device of the present invention has a first electrode 2 as an anode on a substrate 1 in the shape of stripe. Partition walls are formed between the first electrodes. It is desirable that partition walls 7 cover the first electrode ends for the purpose of preventing a short circuit due to burr of the first electrode edge.

And an organic electroluminescence device of the present invention has an organic EL layer including an organic light emitting layer and a light emitting assist layer in a region sectioned by partition walls 7, the organic EL layer being on first electrodes 2.

As for the organic EL layer sandwiched between the first electrodes and the second electrodes, even an organic light emitting layer alone is preferable, and even a laminate of an organic light emitting layer and a light emitting assist layer is preferable.

As a light emitting assist layer, there are a hole transport layer, a hole injection layer, an electron transport layer, an electron injection layer and a charge generation layer.

The organic EL layer which is a laminate of a hole transport layer 3 that is a light emitting assist layer and organic light emitting layers (41, 42, 43) is shown in FIG. 4.

A hole transport layer 3 is formed on a first electrode 2.

Red (R) organic light emitting layer 41, green (G) organic light emitting layer 42 and blue (B) organic light emitting layer 43 are formed on a hole transport layer 3 respectively.

Next, as a cathode, second electrode 5 is placed on an organic light emitting layer to be facing with first electrode 2 which is anode.

In the case of a passive matrix method, second electrode is formed in the shape of stripe to be perpendicular to stripe first electrode. In the case of an active matrix method, second electrode is formed on a whole area of an organic electroluminescence device.

Further, sealing body such as glass cap 8 is stuck on a whole area of effective picture elements by an adhesive 9 to prevent infiltration of moisture and oxygen to the first electrode, the organic light emitting layer, the light emitting assist layer and a second electrode.

An organic electroluminescence device of the present invention comprises a substrate, pattern-formed first electrodes supported by the substrate, an organic light emitting layer and a second electrode.

An organic electroluminescence device of the present invention may be reverse structure shown in FIG. 4. In other words, a first electrode may be a cathode. A second electrode may be an anode.

Instead of sealing body such as glass caps, an organic electroluminescence device may have a sealing substrate including a passivation layer, a protective layer or a layer having their two functions.

A passivation layer protects an organic light emitting medium layer and electrodes from infiltration of outside oxygen and moisture. A protective layer protects an organic light emitting medium layer and electrodes from external stress.

Next, a method for manufacturing an organic EL device is described.

A substrate having insulating property can be used as a substrate. In the case of an organic electroluminescent device of bottom emission method, it is necessary to use a clear substrate.

For example, a glass substrate and a quartz substrate can be used. In addition, a plastic film and sheet such as polypropylene, polyether sulfone, polycarbonate, cyclo olefin polymers, polyarylate, polyamide, polymethyl methacrylate, poly ethylene terephthalate and polyethylenenaphthalate can be used. Metallic oxide thin film, metal fluoride thin film, metal nitride thin film, metal oxynitriding membrane thin film or macromolecule resin film may be formed on a plastic film or sheet to prevent moisture from entering an organic light emitting medium layer.

In addition, it is preferable for a substrate to be heated beforehand. Moisture adsorbed in internal and surface of a substrate is reduced by heating. In addition, depending on a material laminated on a substrate, surface of a substrate may be processed by processing such as ultrasonic cleaning processing, corona discharge treatment, plasma treatment and UV ozonization for improvement of adhesion.

Figure 5:
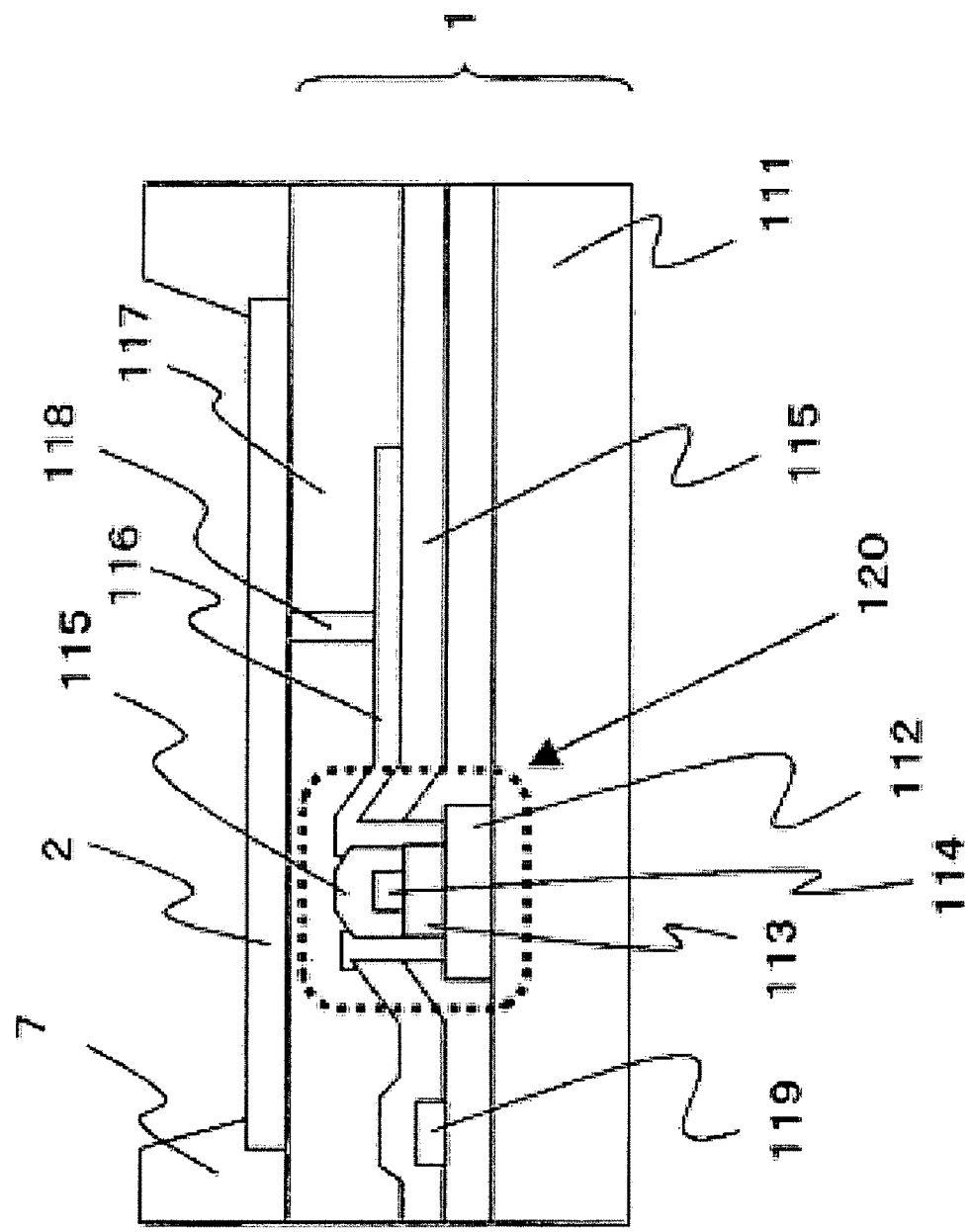
FIG. 5 is an explanatory cross-sectional diagram of one example of an active matrix type substrate used for an organic EL device of the present invention.

In addition, thin film transistor (TFT) is formed on a substrate, thereby a substrate for an organic electroluminescent device of active matrix method can be made. Illustration cross figure of an example of a substrate of active matrix method of the present invention is shown in FIG. 5. On TFT 120, planarizing layer 117 is formed. A bottom electrode (the first electrode 2) of an organic electroluminescent device is formed on planarizing layer 117. Contact hole 118 is installed in planarizing layer 117. The bottom electrode is electrically connected to TFT by means of contact hole 118. Due to such a constitution, superior electrical insulating property can be achieved between TFT and an organic electroluminescent device. Insulating film between layers 115 is necessary. In FIG. 5, data line 119 is also illustrated.

TFT 120 and the upward organic electroluminescent device are supported with support medium 111. Support medium 111 should be superior in mechanical intensity and dimensional stability. Materials exemplified as materials for a substrate can be used as materials for support medium 111.

For thin film transistor 120 in a support medium, well-known thin film transistor can be used. Thin film transistor comprising the active layer that a source/drain region and a channel area are formed, the gate insulator and the gate electrode is exemplified. Configuration of thin film transistor is not limited especially. By way of example only, staggered type, reverse staggered type, top gate type and coplanar type can be used.

Active layer 112 is not limited especially. By way of example only, it can be formed by inorganic semiconductor material such as amorphia Si, polycrystalline silicon, crystallite Si, cadmium selenide or organic semiconductor material such as thiophene oligomer, poly(phenylene vinylene).

These active layers are made by the following methods:

1. A method to do ion doping after having laminated amorphous silicon by plasma CVD technique.

2. A method comprising the following process: Amorphous silicon is formed by LPCVD method using $SiH_4$ gas. By means of crystallization of amorphous silicon by solid phase epitaxy, a poly Si is obtained. Ion doping is done by ion implantation method.

3. A low temperature processing method comprising the following process:

Amorphous silicon is formed. By way of example only, $Si_2H_6$ gas is used, and amorphous silicon is formed by LPCVD method. Amorphous silicon is formed by PECVD method by means of $SiH_4$ gas. It is annealed by laser such as excimer lasers. A poly Si is obtained by crystallization of amorphous silicon. Ion doping is done by ion doping method.

4. A high temperature processing method comprising the following process: A poly Si is laminated by low pressure CVD method or LPCVD method. Thermal oxidation is done in more than 1,000 degrees Celsius, and gate insulator is formed. Thereupon, gate electrode 114 of an n+ poly Si is formed. Ion doping is done by ion implantation method.

For gate insulator 113, conventional gate insulator can be used. By way of example only, $SiO_2$ formed by PECVD method or LPCVD method and $SiO_2$ made by thermal oxidation of polysilicon film can be used.

For gate electrode 114, a conventional gate electrode can be used. By way of example only, metal such as aluminum, copper, refractory metal such as titanium, tantalum, tungsten, a poly Si, silicide of refractory metal and polycide can be used.

For configuration of thin film transistor 120, a single gate structure, a double gate structure, multiple gating configuration having gate electrodes more than 3 are exemplified. In addition, LDD configuration, offset configuration may be provided. Even more particularly, thin film transistors more than 2 may be placed all over one pixel.

It is necessary for a display unit of the present invention to be connected to so that thin film transistor functions as a switching element of an organic electroluminescent device. Drain electrode 116 of transistor is connected electrically with pixel electrodes (the first electrodes 2) of an organic electroluminescent device. In the case of top emission configuration, it is necessary for metal reflecting back light to be used as pixel electrodes.

Drain electrode 116 of thin film transistor 120 is connected with pixel electrodes (the first electrodes 2) of an organic electroluminescent device by a connection electric wiring. A connection electric wiring is formed in contact hole 118 penetrating through planarizing layer 117.

For a material of planarizing layer 117, inorganic materials such as $SiO_2$, spin-on-glass, SiN ($Si_3N_4$), TaO ($Ta_2O_5$) and organic materials such as polyimide resin, acrylic resin, photoresist material and black matrix material can be used. Spin coating, CVD and evaporation method can be selected depending on these materials. A photosensitive resin is used as a planarizing layer if necessary, and, by procedure of photolithography, contact hole 118 is formed. Or after having formed a planarizing layer on a whole area, contact hole 118 is formed by dry etching or wet etching in position corresponding to lower thin film transistor 120. Contact hole is buried by conductive material. And, the contact hole is connected with pixel electrodes on a planarizing layer. A planarizing layer should be able to cover up TFT, capacitor and electric wiring. Thickness of the planarizing layer should be several μm, and, by way of example only, it is about 3 μm.

The first electrode 2 is formed on a substrate. When the first electrode is an anode, the following material can be used: metal complex oxide such as ITO (indium tin complex oxide), IZO (indium zinc complex oxide), stannic oxide, zinc oxide, indium oxide and zinc aluminium complex oxide; metallic substances such as gold, platinum and chromium; and a layer stack comprising these materials.

A formation method of the first electrode is explained below.

Dry method such as resistance heating evaporation method, electron-beam evaporation technique, reactivity evaporation method, ion plating method and sputtering method can be used depending on the material.

In addition, ITO is preferable for reasons of the follows: low electrical resistance, high solvent resistance, and transparentness (in the case of bottom emission method).

ITO is formed on a glass substrate by sputter method. The first electrode 2 is formed by patterning of ITO by photolithography method.

After having formed a first electrode 2, partition wall 7 is formed to cover first electrode edges. Partition walls 7 have to have insulating property. By reason of the formation of partition wall, photosensitive materials can be used.

A positive type and negative type can be used as a photosensitive material. Light hardening resins such as photo radical polymerization system, photo cation cure corollary or copolymer containing acrylonitrile composition, poly vinylphenol, polyvinyl alcohol, novolac resin, polyimide resin and cyanoethyl pullulan can be used. In addition, as formation material of partition wall, $SiO_2$ and $TiO_2$ can be used.

When a formation material of a partition wall is a photosensitive material, solution of a formation material is coated by slit coat method or spin coating method entirely. And patterning is performed by photolithography method including exposure process and development process. In the case of spin coating method, height of partition wall can be controlled under conditions of rotation number. However, only by one coating, height of partition wall is limited. If spin-coating process is repeated more than once, partition wall of height more than the limited height is able to be formed.

When a partition wall is formed by photolithography method using a photosensitive material, configuration of partition wall is controllable by exposure condition and development condition. Examples are described below.

A photosensitive resin of negative type is used. By exposure, development and post-bake, a partition wall is formed. Configuration of a partition wall end is taper configuration.

Development conditions such as a kind, density, temperature of a photographic developer or developing time should be controlled to form a partition wall of taper configuration.

When condition of development is mild, the following partition wall is formed: Configuration of a partition wall end is taper configuration.

On the contrary, when development condition is strong, the following partition wall is formed: Configuration of a partition wall end is inverse configuration of taper configuration.

In addition, when a formation material of a partition wall is $SiO_2$ or $TiO_2$, a partition wall can be formed by dry method such as sputtering method or chemical vapor deposition. For this case, patterning of a partition wall can be performed by a mask or photolithography method.

An organic EL layer including an organic light emitting layer and a light emitting assist layer is formed next.

An organic EL layer between electrodes may be only one layer consisting of an organic luminescent layer. An organic EL layer may be plural layers consisting of an organic light emitting layer and a light emitting assist layer. A light emitting assist layer is a layer which helps an organic light emitting layer to emit light. As a light emitting assist layer, a hole transport layer, a hole injection layer, an electron transport layer, an electron injection layer and a charge generation layer are exemplified. In addition, a hole transport layer, a hole injection layer, an electron transport layer, an electron injection layer and a charge generation layer can be selected appropriately.

In the present invention, at least one layer among organic EL layers including an organic light emitting layer and light emitting assist layers such as an organic light emitting layer, a hole transport layer, a hole injection layer, an electron transport layer, an electron injection layer and an electron generation layer, can be formed over the first electrode using an ink by a relief printing method using a resin relief printing plate having a convex resin pattern on a base material, the ink being prepared by dissolving or dispersing an organic EL layer material in a solvent. Hereinafter, an embodiment in which an organic light emitting ink is used is described, the ink being prepared by dissolving or dispersing an organic light emitting material in a solvent.

An organic light emitting layer is the layer which emits light when electric current flows.

The following material can be used as an organic light emitting material of an organic light emitting layer:

The following low molecular type light emitting material can be used: 9,10-diaryl anthracenes, pyrene, coronene, perylene, rubrene, 1,1,4,4-tetra phenylbutadiene, tris(8-hydroxyquinolonate) aluminium complex, tris(4-methyl-8-hydroxyquinolonate) aluminium complex, bis(8 hydroxyquinolonate) zinc complex, tris(4-methyl-5-trifluoromethyl-8-hydroxyquinolonate) aluminium complex, tris(4-methyl-5-cyano-8-hydroxyquinolonate) aluminium complex, bis(2-methyl-5-trifluoromethyl-8-quinolinolate) [4-(4-cyanophenyl) phenolate]aluminium complex, bis(2-methyl-5-cyano-8-quinolinolate) [4-(4-cyanophenyl) phenolate] aluminium complex, tris(8-quinolinolate) scandium complex, bis[8-(para-tosyl) aminoquinoline]zinc complex and cadmium complex, 1,2,3,4-tetraphenylcyclopentadiene and poly-2,5-diheptyloxi-para-phenylenevinylene.

In addition, the material which the following low molecular type luminescent material is scattered in a polymeric material can be used: coumarin system fluorescent substance, perylene system fluorescent substance, pyran type fluorescent substance, anthrone system fluorescent substance, porphyrin system fluorescent substance, quinacridon system fluorescent substance, N,N'-dialkyl displacement quinacridon system fluorescent substance, naphthalimido system fluorescent substance, N,N'-diaryl displacement pyrrolo pyrrole series fluorescent substance and phosphorescence fluor such as Ir chelate. Polystyrene, polymethyl methacrylate and polyvinylcarbazole can be used as a polymeric material.

In addition, the following macromolecule luminescent materials can be used: poly(2-decyloxy-1,4-phenylene) (DO-PPP), poly[2,5-bis-[2-(N,N, N-triethylammonium) ethoxy]-1,4-phenyl-alt-1,4-phenylene]a dibromide (PPP-NEt3+), poly[2-(2'-ethyl hexyloxy)-5-methoxy-1,4-phenylenevinylene](MEH-PPV), poly[5-methoxy-(2-propanoxysulfide)-1,4-phenylenevinylene](MPS-PPV), poly[2,5-bis-(Hexyloxy)-1,4-phenylene-(1-cyano vinylene)](CN-PPV), a polyphenylene vinylene (PPV) derivative such as the above, poly(9,9-dioctyl fluorene) (PDAF) and polyspirofluorene. Macromolecule precursor such as PPV precursor and PPP precursor can be used. In addition, existing luminescent material can be used.

Example of a hole transport material comprising a hole transport layer is described below:

copper phthalocyanine, metallophthalocyanine such as tetra(t-butyl) copper phthalocyanine, metal-free phthalocyanine, quinacridon chemical compound, aromatic amine type low molecular hole injection transportation material such as N,N'-di(1-naphthyl)-N,N'-diphenyl-1,1'-biphenyl-4,4'-diamine, 1,1-bis(4-di-p-tolylamino phenyl)cyclohexane, N,N'-diphenyl-N,N'-bis(3-methylphenyl)-1,1'-biphenyl-4,4'-diamine, macromolecule hole transport materials such as polyaniline (PANI), polythiophene, polyvinylcarbazole, mixture with poly(3,4-ethylenedioxy thiophene) (PEDOT) and polystyrene sulfonate, polythiophene oligomer material and other existing hole transport materials.

As an electron transport material used for an electron transport layer, the following material is exemplified:

2-(4-Biphenyl-il)-5-(4-t-butylphenyl)-1,3,4-oxadiazole, 2,5-Bis(1-naphthyl)-1,3,4-oxadiazole, Oxadiazoles, Bis(10-hydroxybenzo[H]quinolinolate) beryllium complex, and triazole compound.

By means of dissolving or dispersing an organic light emitting material with a solvent, an organic light emitting ink is made. As a solvent, toluene, dimethylbenzene, acetone, hexane, methyl ethyl ketone, methyl isobutyl ketone, cyclohexanone, methanol, ethanol, isopropyl alcohol, ethyl acetate, butyl acetate, 2-methyl-(t-butyl)benzene, 1,2,3,4-tetra methylbenzene, pentyl benzene, 1,3,5-triethylbenzene, cyclohexylbenzene and 1,3,5-tri-isopropyl benzene can be used.

The above described material may be used alone. In addition, the above described material is mixed, and it may be used.

In addition, detergent, antioxidant, viscosity modifier and UV absorber may be added in an organic light emitting ink as needed.

For a solvent in which a hole transport material and an electron transport material are dissolved or dispersed, a toluene, xylene, acetone, methyl ethyl ketone, methyl isobutyl ketone, cyclohexanone, methanol, ethanol, isopropanol, ethyl acetate, butyl acetate, water and the like can be used.

These solvents may be used alone. Or these combined solvent may be used.

Water or alcohols are especially preferred to make a ink of a hole transport material.

An organic light emitting layer or a light emitting assist layer is formed by a wet method.

In addition, when the layer sandwiched between electrodes is a laminate, all of layers of the laminate are not necessary to be formed by a wet method.

For wet method, the following method can be used: application methods such as a spin coat method, a die coat method, a dip coat method, a discharge coat method, a precoat method, a roll coat method and a bar coat method, and printing methods such as relief printing, ink jet process, offset printing and photogravure process.

When pattern-shaped organic light emitting layers of three colors of RGB are formed, it can be formed selectively on picture element regions by a printing method. Therefore, an organic electroluminescent device of full colors can be manufactured. The film thickness is equal to or lower than 1,000 nm whether the organic luminescent medium layer is monolayer or a laminate. Preferably it is 50 nm-150 nm.

As mentioned above, the present invention is used not only for a case where an organic light emitting layer is formed by a relief printing method using an organic light emitting ink, but also for a case where a light emitting assist layer such as a hole transport layer or an electron transport layer is formed by a relief printing method using a hole transport ink or an electron transport ink.

Next, a second electrode is formed.

When a second electrode is a cathode, the following material is used: the material that electron injection efficiency is high.

In some embodiments, metal such as Mg, Al and Yb can be used. In addition, the following second electrode may be used: thin layer such as Li, or LiF of film thickness about 1 nm is provided on the surface of a light emitting medium; and the metal membrane with high stability and high conductivity is laminated on this thin layer. Al and Cu can be exemplified for such a metal having high stability and high conductivity.

In addition, the following material can be used as a material of a second electrode to balance stability with electron injection efficiency: alloy with the metal having low work function and the stable metals such as Ag, Al and Cu. For example, MgAg, AlLi, and CuLi can be used as such an alloy.

It is desirable to select a material having translucency in so-called top emission construction that visible radiation comes out of the second electrode side.

By way of example only, rarefaction by assembly of these metals and clear electrically conducting layer such as ITO is enabled.

As a formation method of a second electrode, dry process method such as resistance heating evaporation method, electron-beam evaporation technique, reactivity evaporation method, ion plating method and sputtering method can be used depending on the material. In addition, patterning can be done by using a mask when patterning of a second electrode is necessary. As for the thickness of a second electrode, 10 nm-1,000 nm are preferable.

In addition, a first electrode may be a cathode in the present invention. A second electrode may be an anode.

As an organic electroluminescent device, an organic light emitting layer is sandwiched between electrodes, and it can emit light by applied electric current. However, an organic light emitting material, a light emitting assist layer forming material and electrodes forming material deteriorate easily by means of atmospheric moisture and oxygen. Thus a seal to intercept an organic light emitting layer and the like from the outside is usually provided.

A glass cap and a metal cap having a concavity are used, and an organic electroluminescent device can be sealed. A top face of a second electrode corresponds to the concavity. About the penumbra, the cap and the substrate are adhered.

A sealing body is explained below.

By way of example only, a substrate on which a first electrode, an organic light emitting layer, an organic light emitting assist layer and a second electrode are formed is prepared. A resin layer is provided over a sealing medium. A sealing medium is stuck on a substrate by means of a resin layer.

For a sealing medium, it is necessary for transmissivity of moisture and oxygen to be low.

In addition, as an example of a material for a sealing medium, ceramics such as alumina, silicon nitride, boron nitride, glass such as no-alkali glass, alkali glass, quartz, metallic foil such as aluminium or stainless, humidity resistance film are exemplified.

By way of example only, the following humidity resistance film is exemplified:

a film in which SiOx is formed by CVD method on both sides thereof, a film in which a film having a small transmissivity of moisture and oxygen and a hydrophilic film are laminated; and a film in which water absorption agent was applied thereon, the film having small transmissivity of moisture and oxygen.

It is preferable for water vapor permeation rate of the humidity resistance film to be equal to or less than $10^{-6} g/m^2/day$.

For example, for a resin layer, the following material can be used:

A photo-curing adhesive property resin, a heat curing adhesive property resin, 2 fluid hardening adhesive property resins comprising an epoxy type resin, acrylic resin, silicone oil and the like, acrylic resin such as ethylene ethylacrylate (EEA) polymer, vinyl resins such as ethylene vinyl acetate (EVA), thermoplastic resin such as polyamide, a synthetic rubber, thermoplasticity adhesive property resins such as acid denatured substances of polyethylen or polypropylene.

An example of method to form a resin layer on a sealing medium is shown below: solvent solution method, pushing out laminate method, fusion/hot melt method, calender method, discharge jet application method, screen printing, vacuum laminate method and heated roll laminate method.

A material having hygroscopicity and a property to absorb oxygen can be incorporated into a resin layer if necessary.

Depending on size and configuration of a sealed organic electroluminescent display unit, thickness of a resin layer formed on a sealing medium is decided. As for the thickness of a resin layer, about 5-500 µm are desirable.

In a sealing room, a substrate with a first electrode, an organic light emitting layer, a light emitting assist layer and a second electrode is affixed to a sealing body.

When it is two layer construction consisting of a sealing medium and a resin layer of thermoplastic resin, contact bonding should be performed only by heating roller.

In the case of a heat curing type adhesion resin, it attaches by pressure by heating roller. And a heat curing type adhesion resin is heated, and is hardened.

At first, in the case of a photo-curing-related adhesion resin, it is sealed by pressure by roller. And a photo-curing-related adhesion resin is stiffened by irradiating light.

In addition, in the above described example, a resin layer is formed on a sealing medium. However, after having formed a resin layer on a substrate, it may be stuck with a sealing medium.

Before sealing by means of a sealing body or instead of sealing by means of a sealing body, inorganic thin film may be formed. By way of example only, as a passivation film, a silicon-nitride film having a thickness of 150 nm is formed by CVD method. In addition, a sealing body consisting of an inorganic thin film can be formed.

Figure 7:
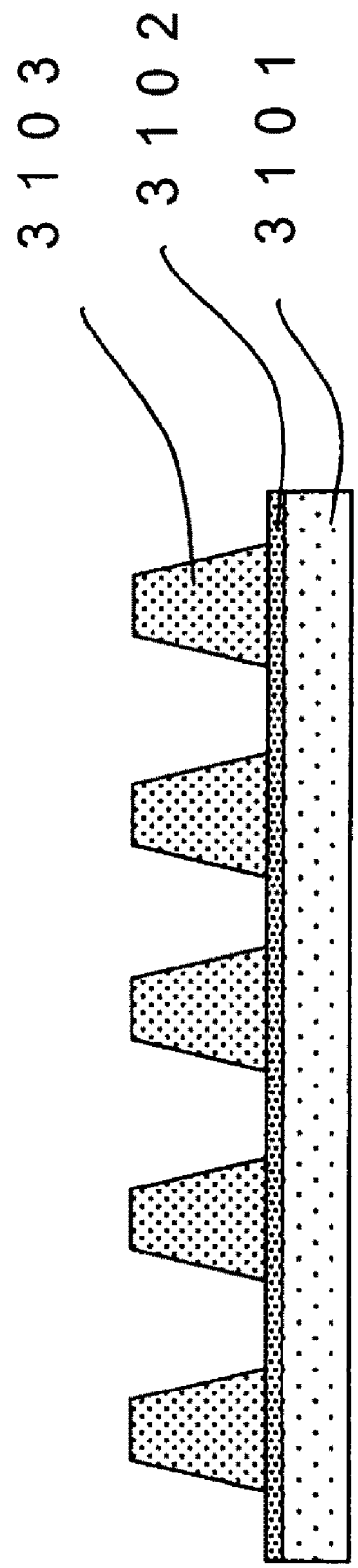
FIG. 7 is a partially explanatory diagram showing a conventional example of a relief printing plate for forming a thin film layer of an organic electronic device.

Hereinafter, another embodiment of the present invention is described referring to figures. FIG. 7 is a partial explanatory diagram of an example of a conventional relief printing plate for forming a thin film layer of an organic electronic device. The relief printing plate has a metal substrate and a resin pattern formed thereon. In FIG. 7, an adhesive layer 3102 is formed between a metal substrate 3103 and a convex pattern part 3103. If the convex pattern part 3103 sufficiently adheres to the metal substrate 3101, the adhesive layer 3102 is not necessary. In addition, in the case where an ink used for a printing is acid, an adhesive layer 3102 is a protective layer which prevents the metal substrate 3103 from being decomposed by the acid ink.

Figure 8:
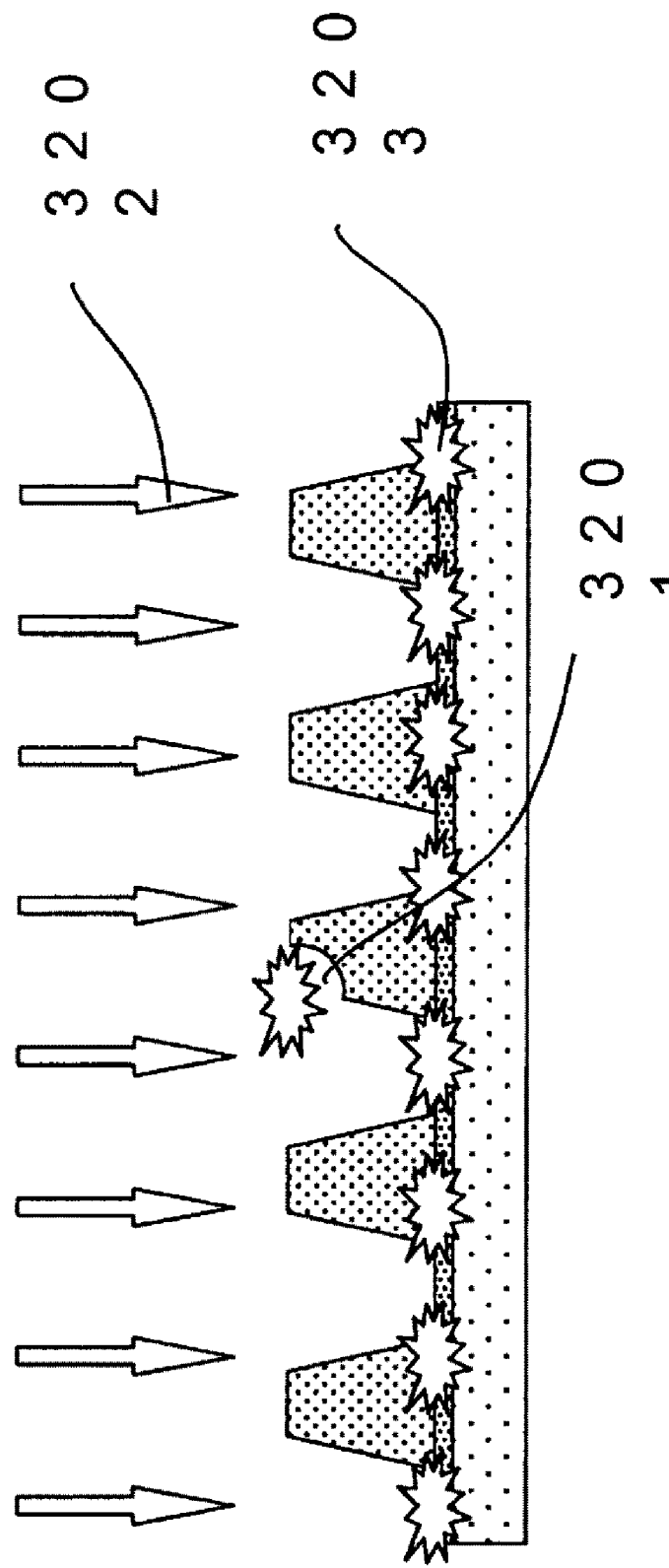
FIG. 8 is a partially explanatory diagram showing a conventional example of a relief printing plate for forming a thin film layer, the plate having a defect.

In FIG. 8, the relief printing plate for forming a thin film layer, shown in FIG. 7, has a defect. FIG. 7 shows a state where the defect of the plate is checked. Dark view lighting is used for an inspection light 3203 used for checking the defect.

In dark view lighting, a light axis of coaxial vertical light or incident light, both lights irradiating the substrate form a pattern side of the substrate, is different from a light axis of an incident light to a detector (not shown in the figure). In this case, the inspection light 3202 reflects diffusely at a part of pattern defect 3201 and is detected by a detector of a checking apparatus (not shown in the figure). However, the inspection light 3202 also reflects diffusely on the metal substrate 3101. Therefore, the reflected lights can not be distinguished from each other.

Figure 9:
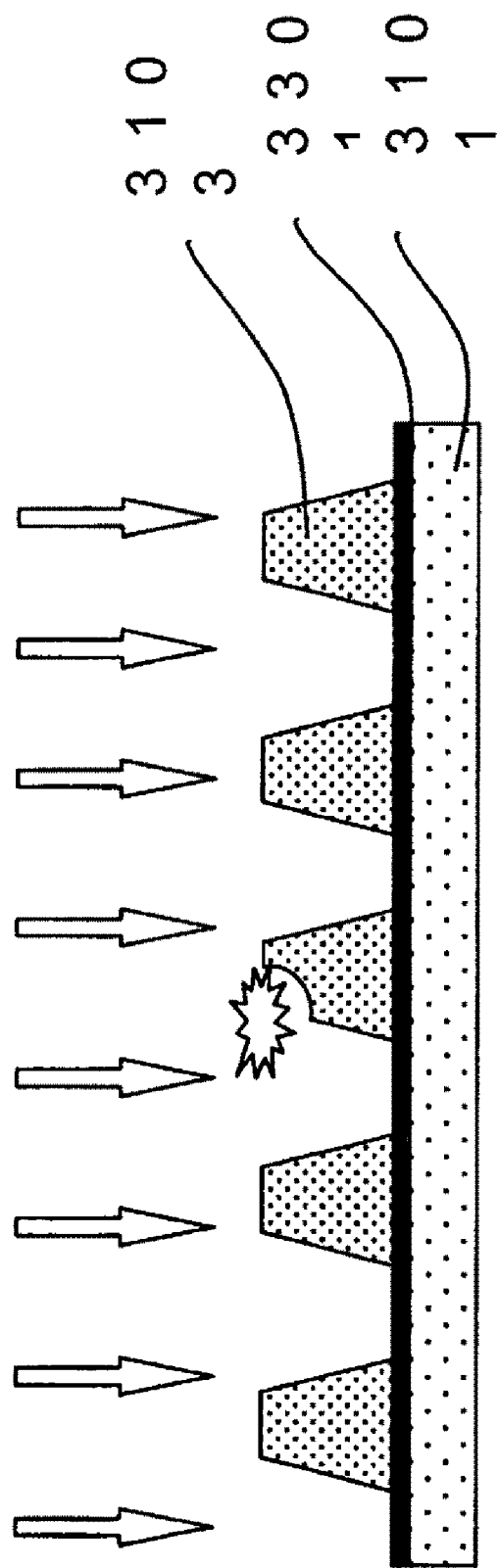
FIG. 9 is an explanatory diagram showing an example of a relief printing plate of the present invention.

FIG. 9 is an explanatory diagram of an example of a relief printing plate of the present invention. As shown in the figure, a light absorption layer 3301 is formed between a metal substrate and a convex pattern part. The convex pattern part has a defect same as FIG. 8. Optical check is performed by irradiating this relief printing plate with incident light. In FIG. 9, a light absorption layer is formed, thereby light does not reflect diffusely on the metal substrate. Therefore, light is reflected only at the defect of the convex pattern part. Therefore, a pattern image detected by a detector of a checking apparatus has a sufficient contrast, thereby finding a defect is possible.

Figure 10:
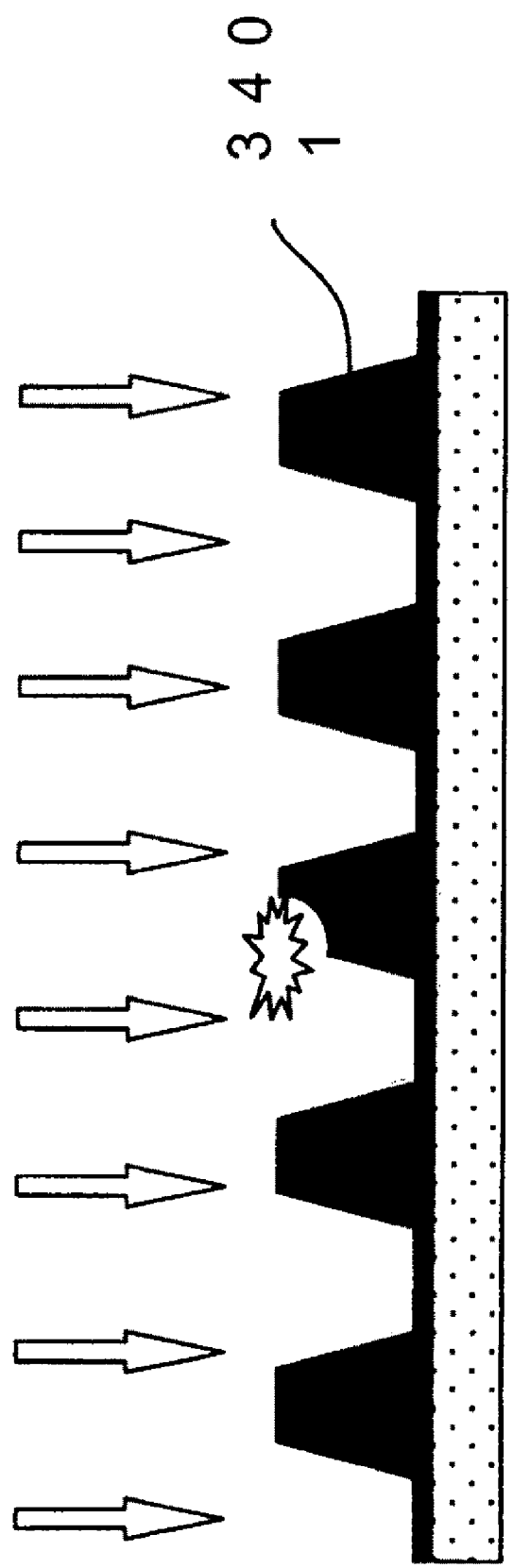
FIG. 10 is an explanatory diagram showing another example of a relief printing plate of the present invention.
Figure 11:
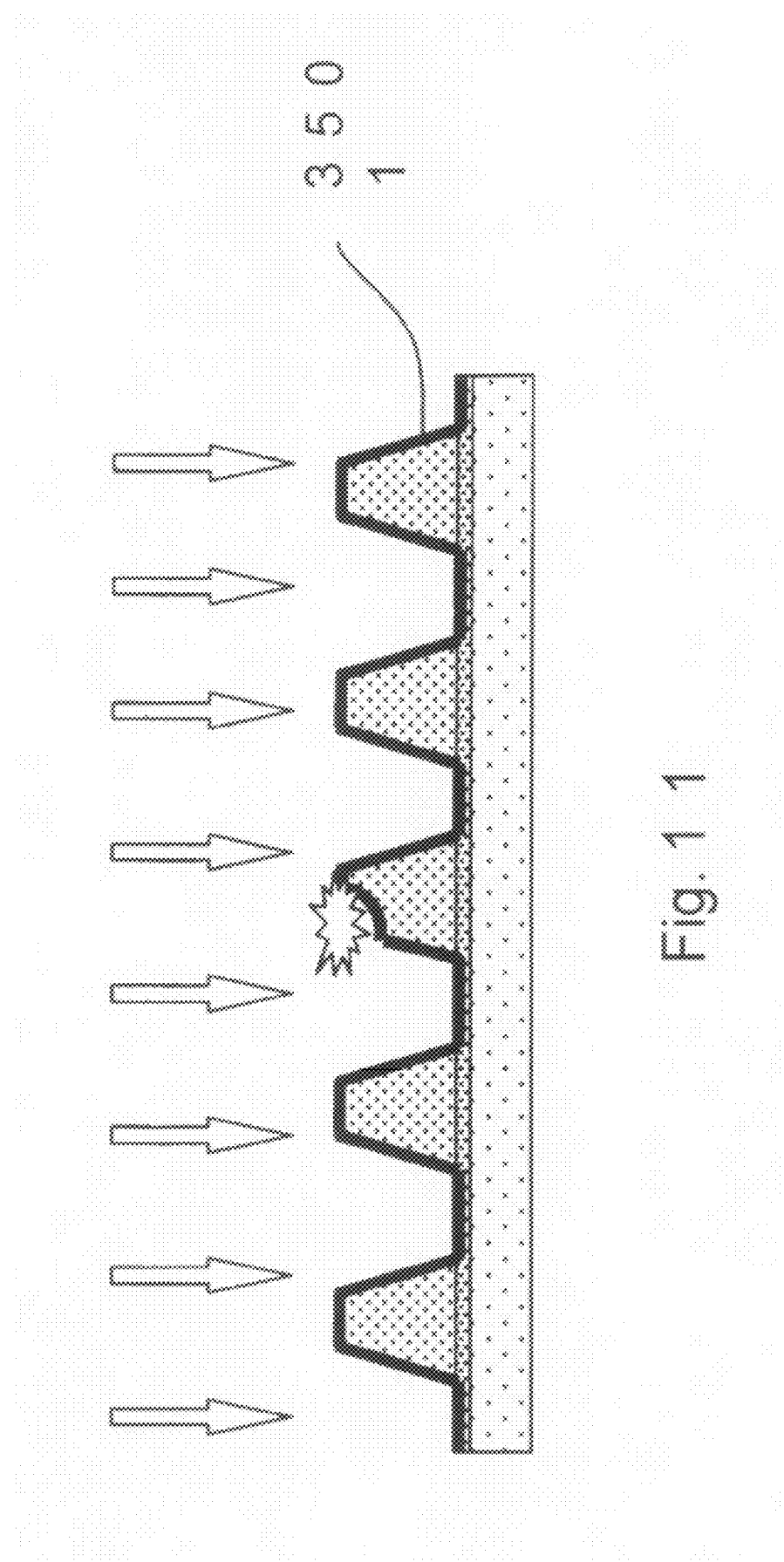
FIG. 11 is an explanatory diagram showing another example of a relief printing plate of the present invention.

In addition, in an example of FIG. 9, the light absorption layer is formed on the entire surface of the metal substrate, the layer being between the metal substrate and the convex layer. On the other hand, as shown in FIG. 10, a light absorption property relief printing plate 3401 in which a convex part has a light absorption function can be also used. However, in this case, if the convex parts are independent, the lower metal layer is exposed. Thereby, it is necessary for lower part of the convex parts to be connected with each other in order to make light reflect diffusely. That is, the convex layer has a light absorption function and a resin of the convex layer covers the metal substrate. In addition, as shown in FIG. 11, a light absorption layer 3501 covering a surface of a convex layer can be used.

In addition, a light absorption layer shown here may be a layer absorbing light of all visible wave length, that is, a black layer, or may be a layer absorbing light of only a specified wave length. In the case where a light absorption layer absorbing only a specified wave length light is used, light of wave length in a region where light is sufficiently absorbed by a light absorption layer is used for an inspection light at the time of checking a defect. In another embodiment, it is necessary for a filter to be provided in front of a detector which takes a reflection light from the substrate, the filter cutting light which is not absorbed by a light absorption layer.

A method for forming a light absorption layer in a relief printing plate varies according to a position where a light absorption layer is formed. In the case where a light absorption layer is formed between a metal substrate and a convex pattern, before the convex pattern is formed, the light absorption layer is formed on the metal substrate. In this case, the light absorption layer can be formed by applying or laminating a resin including color material for absorbing light on the metal substrate. A dye or a pigment which can be generally used can be used for the color material for absorbing light. In addition, the light absorption layer can be formed on the metal substrate by a plating process. Electroless black nickel plating, black chromium plating, blackening processed copper plating layer and zinc plating layer in which black chromating is performed can be used for a plating layer absorbing light.

It is necessary for these light absorption layers to be resistant to an ink or a solvent thereof. Therefore, a light absorbing plating layer is suitable for an aromatic system organic solvent ink for forming an organic light emitting layer. Therefore, it is desirable that a resin layer including a color material be used for an ink for forming an acid organic light emitting assist layer such as PEDOT(polyethylen dihydroxy thiophen)/PSS(polystyrene sulfonate) water solution.

In addition, in the case where a light absorption layer is formed as a pattern part of a relief printing plate, the pattern part can have a light absorption property by mixing a color material with a resin for convex part. However, in this case where a convex part is formed, if a photo-curing type resin is used for a resin material, it is necessary for absorptive wavelength of the included color material to be selected so that the color material does not prevent the resin from hardening. In addition, it is necessary for solubility of the color material to be considered so that the included color material is not dissolved out in an ink. In this case, as for a color material, degree of solubility of a pigment is lower than degree of solubility of a dye. Therefore, a pigment can be preferably used. In the case where a photo-curing resin is used for a material of a relief printing plate, side-chain of a photoreactive monomer can be a light absorption type.

In the case where a light absorption layer is formed on a surface of a convex part of a relief printing plate, the light absorption layer can be formed by applying a solution in which a resin including a color material is diluted with a solvent or by forming a light absorption plating layer on the surface of the convex part by electroless plating.

As a photo-curing type resin for forming a relief printing plate, a composition in which the following materials are mixed can be used:

polyurethane resin, polyimide resin, polyester resin or acryl resin of alkali-solubility;
photopolymerizability monomer; and
photoinitiator.

In addition, in the case where an ink used for printing is a water type, a water-soluble resin can be used for a resin.

If a substrate of a relief printing plate is a metal thin plate, a material of the substrate is not especially limited. In view of coefficient of thermal expansion and easiness of acquisition, a stainless steel plate material such as SUS304 and SUS430 can be used. Especially, in view of coefficient of thermal expansion, an invar material which is an iron-nickel alloy and a super invar material in which cobalt is further added to the iron-nickel alloy can be used.

Figure 12:
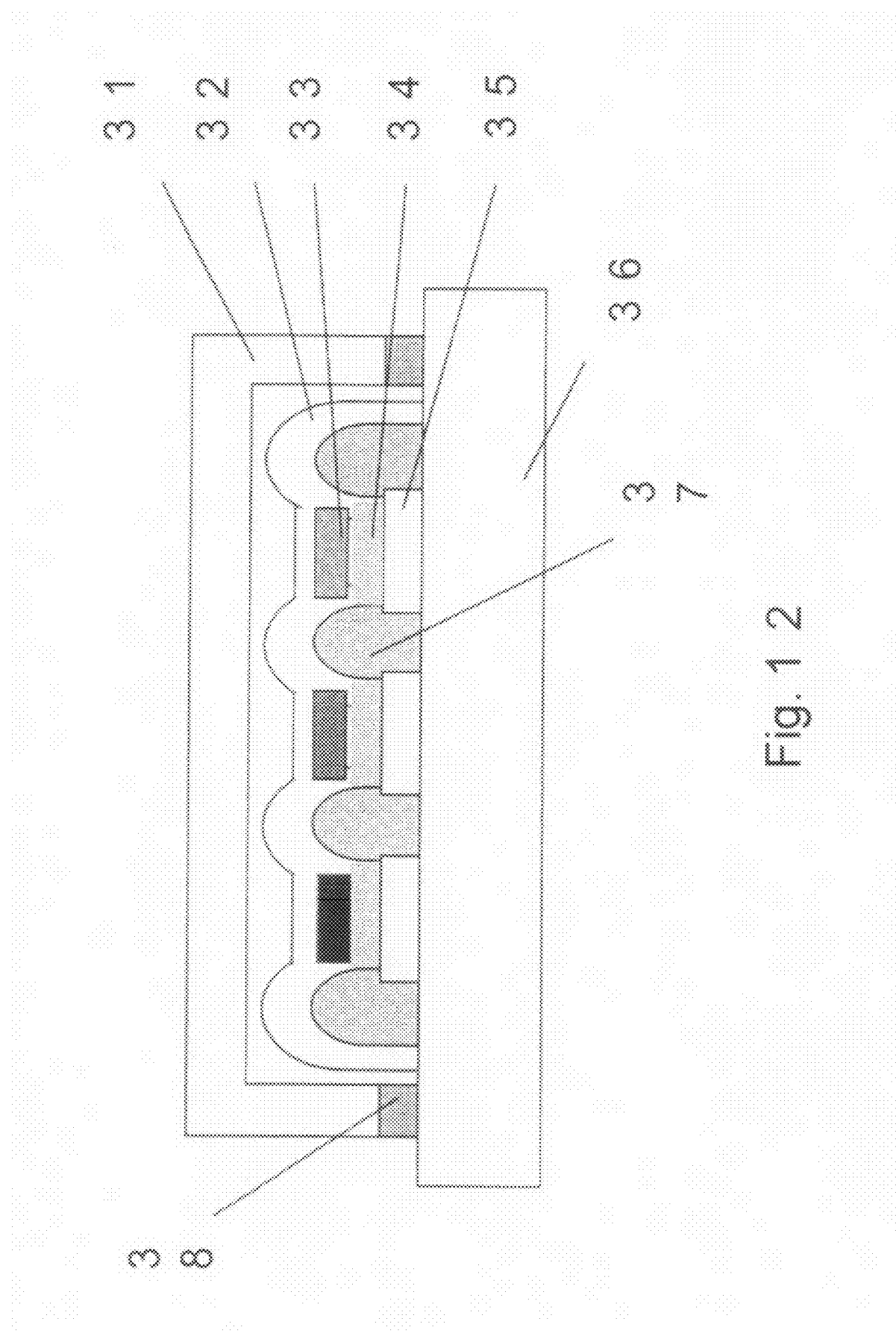
FIG. 12 is an explanatory cross-sectional diagram showing an example of constitution of an organic EL device of the present invention.

Next, an example of a method for manufacturing an organic EL device using a relief printing plate which is checked by a checking method of the present invention is described, wherein an organic EL device is used as an example of an organic electronic device. FIG. 12 is an explanatory diagram of an example of an organic EL device in the present invention.

In FIG. 12, pattern-formed pixel electrodes 35 are formed on a glass substrate 36 as anodes. For materials of pixel electrodes 35, transparent electrode materials such as ITO (indium tin complex oxide), IZO (indium zinc complex oxide), tin oxide, zinc oxide, indium oxide and aluminium oxide complex oxide can be used.

In addition, electrical resistance of ITO is low. ITO has solvent resistance. ITO is transparent. Therefore, ITO is preferable.

ITO is formed on a substrate by sputter method. Patterning of ITO is performed by photolithography method. ITO becomes line-shaped pixel electrodes 35 in this way.

An insulator layer 37 is formed between adjacent pixel electrodes by photolithography method using a photosensitive material after line-shaped pixel electrodes have been formed.

After insulator layer 37 is formed, hole transport layer 34 is formed. Examples of hole transport materials which forms hole transport layer 34 include poly aniline derivative, poly thiophenes, polyvinylcarbazole (PVK) derivative and poly(3, 4-ethylenedioxy thiophene) (PEDOT). These materials are mixed with or are added to a polymer such as polystyrene sulfonate (PSS). Thereafter, these materials are dissolved or dissolved in a solvent to form a hole transport ink. In the present invention, a hole transport layer 34 is formed by applying the hole transport ink in each pixel in accordance with a pixel pattern using a relief printing method.

In the case of a relief printing method by which a hole transport layer 34 is formed, a relief printing plate checked by a checking method of the present invention is used. In addition, after having formed a hole transport layer 34, an organic light emitting layer 33 is similarly formed by a relief printing method.

Examples of organic light-emitting materials for forming the organic light emitting layer 33 include 1. organic light-emitting materials in which light emitting color materials such as coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in polymers such as polystyrene, polymethyl methacrylate and polyvinyl carbazole,
2. and polymeric organic light-emitting materials of polyarylene system, polyarylene vinylene system and polyfluorene system.

Organic light emitting ink is prepared by dissolving or dispersing these organic light emitting materials in a solvent.

For a solvent dissolving or dissolving an organic light emitting material, toluene, xylene, acetone, anisole, methyl ethyl ketone, methyl isobutyl ketone and cyclohexanone can be used. The above-mentioned solvent may be used alone. In addition, the above mentioned solvent may be used as a mixed solvent.

Above all, aromatic organic solvent such as toluene, xylene and anisole is preferred from an aspect of solubility of an organic light emitting material.

A printing apparatus for forming a hole transport layer and an organic light emitting layer is described below.

Figure 13:
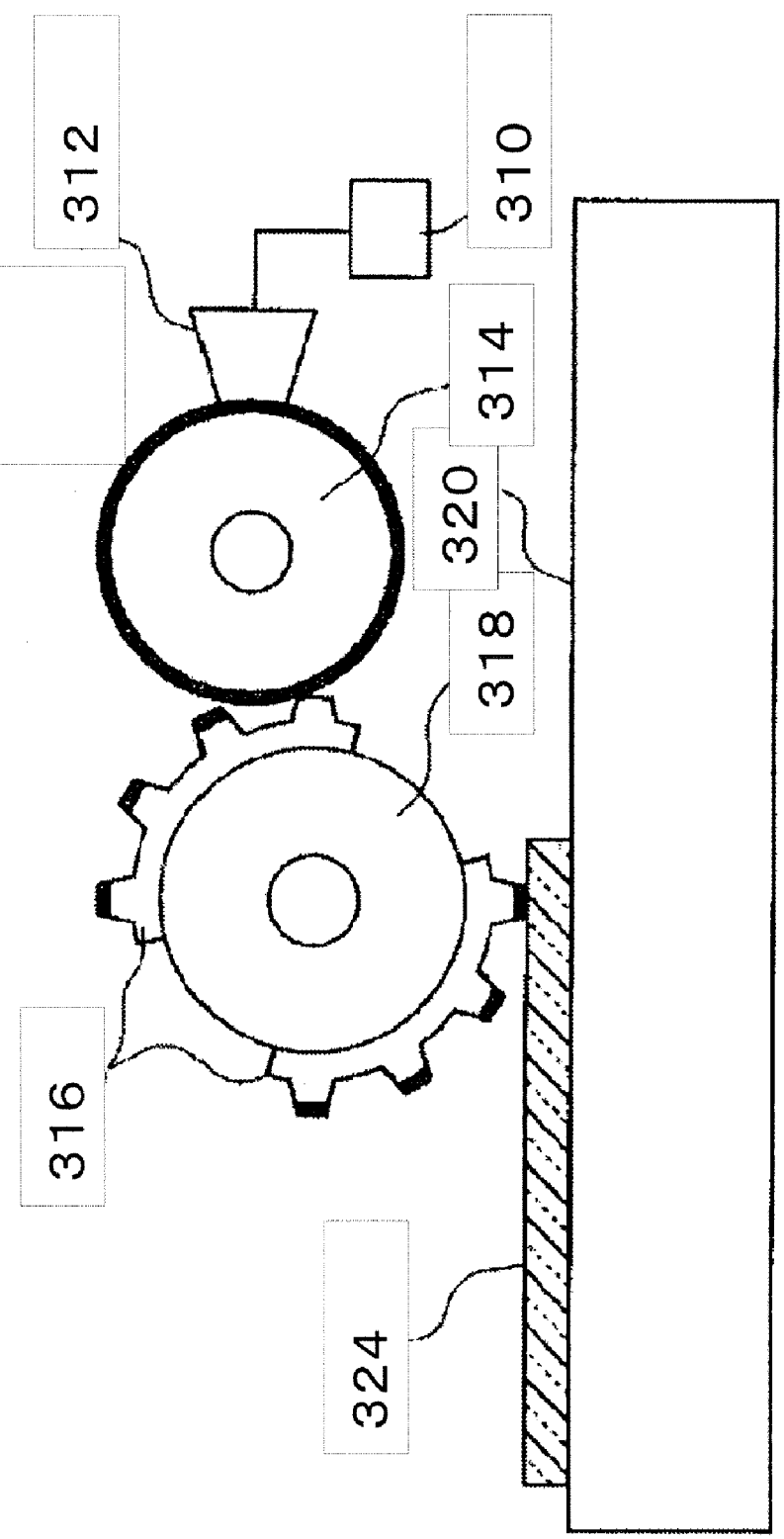
FIG. 13 is a schematic diagram of a relief printing apparatus used for the present invention.

FIG. 13 shows a schematic diagram of a relief printing apparatus.

This relief printing apparatus has an ink tank 310, an ink chamber 312, an anilox roll 314 and a plate cylinder 318 on which a resin relief printing plate 316 of the present invention is equipped. A hole transport ink or an organic light emitting ink is taken to an ink tank 310. An organic light emitting ink is sent into an ink chamber 312 from an ink tank 310. An anilox roll 314 makes contact with an ink feed section of an ink chamber 312 and a plate cylinder 318, and it is rotatably supported.

With rotation of anilox roll 314, an ink layer supplied in an anilox roll surface is formed with uniform thickness. The ink of this ink layer is transferred to a convex part of a resin relief printing plate. Further, a substrate to be printed 324 is fixed to a movable flat-bed printing machine 320. The substrate 324 moves to a printing start position while position adjustment is performed by a position adjustment mechanism which can adjust a position of the relief printing plate and a position of the substrate. And the pattern-shaped ink on the convex part is printed onto a predetermined position of the substrate 324 while the convex part is in contact with the substrate 324 according to the rotation of the plate cylinder.

In this way organic electroluminescent element of color display can be formed.

After having formed organic light emitting layer 33, a line pattern cathode layer 32 which is perpendicular to line pattern pixel electrodes is formed. For a material of a cathode layer 32, the material which is suitable for light emitting property of an organic light emitting layer can be used. For example, metal simple substance such as lithium, magnesium, calcium, ytterbium and aluminium can be used. An alloy of the above mentioned metal simple substance and the stable metal such as gold and silver can be used. In addition, conductive oxidate of indium, zinc, tin or the like can be used. For formation method of a cathode layer, a vacuum evaporation method using a mask can be used.

Finally an organic electroluminescent device is sealed using glass cap 31 and adhesive 38 to protect the organic electroluminescent device from outside oxygen and moisture. An organic electroluminescent display panel can be obtained in this way.

As mentioned above, a defect of an organic electronic device manufactured using a relief printing plate of the present invention is reduced by checking optically the relief printing plate. In addition, this organic electronic device is preferably applied to an organic EL device in which a fine pattern formation is needed. In the case of a display having this organic EL device, yield ratio in the manufacturing process is improved. The reduction of the manufacturing cost is possible. In addition, the present invention can be used not only for manufacturing an organic EL device but also for manufacturing an organic electronic device such as an organic transistor. That is, the present invention can be applied to a wide field. According to the present invention, yield ratio in the manufacturing an organic electronic device can be improved.

In the case where a liquid crystal display (LCD), a plasma display panel (PDP), a rear projection display (RPJ), a Surface-conduction Electron-emitter Display (SED) and a field emission display (FED) are manufactured, a fine electric circuit is formed and used. The present invention can be applied to a printing plate by which this fine electric circuit pattern is formed. However, the present invention can be most preferably applied to a printing plate used for forming an active matrix type organic EL display or an organic TFT substrate.

A light reflection controlling layer, the light being in the wave length range of 400-800 nm, is formed between a resin convex part and a substrate supporting the resin convex part. Thereby, influence of diffusely reflection at a metal substrate is controlled, therefore control of a high definition printing plate by a edge detection method becomes possible In addition, the light reflection controlling layer is formed by a light absorption layer, thereby a more preferable edge detection becomes possible.

In addition, the reflection controlling layer has transmittance of 85% or less in the above-mentioned entire wave length region, thereby fluctuation in measurement can be controlled.

In the case where thickness of the reflection controlling layer is 1 nm-50 μm (1 nm-5 μm is preferable in the case of dry coating), an amount of the used material is minimum while the amount is sufficient to be used. The time for forming the reflection controlling layer is reduced, thereby the production efficiency can be improved.

In the case where a metal substrate is used for a substrate for supporting the relief printing plate, control of a high definition printing plate can be performed, and a printing plate which can print a high definition pattern can be formed.

In addition, according to the present invention, a relief printing plate with little defects, the plate being needed for manufacturing an organic electronic device by a printing method, is provided, and a method for checking a defect is provided. The use of this relief printing plate make it possible to provide a method for manufacturing an organic electronic device with little defects and to provide an organic electronic device with little defects.

EXAMPLE

Hereinafter, an example is described.
(Manufacturing a Substrate to be Printed)

An active matrix substrate having a thin film transistor provided on a supporting body, the transistor functioning as a switching device, a planarizing layer formed over the transistor and a pixel electrode on the planarizing layer, the electrode being electrically connected with the thin film transistor through a contact hole was used for a substrate to be printed. As for the size of the substrate, the diagonal size was 1.8 inch. The number of pixels was 64×64.

A partition wall was formed so that the shape of the partition wall makes it possible to cover an end of the pixel electrode provided on this substrate and to section pixels. The partition wall was formed by the following processes: a positive resist (ZWD6216-6: a product of ZEON CORPORATION) was formed on the entire surface of the substrate by a spin coater so that thickness of the resist was 2 μm; and the partition wall having width of 60 μm was formed by a photolithography. In this way, the pixel region was sectioned so that the number of sub pixel was 192×64 dot and the pitch was 166 μm×498 μm.

A water solution including poly(3,4) ethylenedioxy thiophen/polystyrene sulfonate (PEDOT/PSS) of 1.5% was formed as a hole transport layer on the pixel electrode by a spin coat method so that thickness of the layer was 100 nm. Further, this formed PEDOT/PSS thin film was dried in a reduced pressure at 100° C. for 1 hour, thereby the substrate to be printed was formed.
(Preparation of an Ink for Forming an Organic Light Emitting Layer)

The following organic light emitting inks of red, green and blue (RGB) are prepared:
Red light emitting ink (R): A poly fluorene system derivative is diluted in toluene (1 weight % solution) (a red light emitting material, Red1100: a product of Sumitomo Chemical co., Ltd);
Green light emitting ink (G): A poly fluorene system derivative is diluted in toluene (1 weight % solution) (a green light emitting material, Green1300: a product of Sumitomo Chemical co., Ltd); and
Blue light emitting ink (B): A poly fluorene system derivative is diluted in toluene (1 weight % solution) (a blue light emitting material, Blue1100: a product of Sumitomo Chemical co., Ltd).
(Manufacturing a Resin Plate having a Reflection Controlling Layer)

Figure 6:
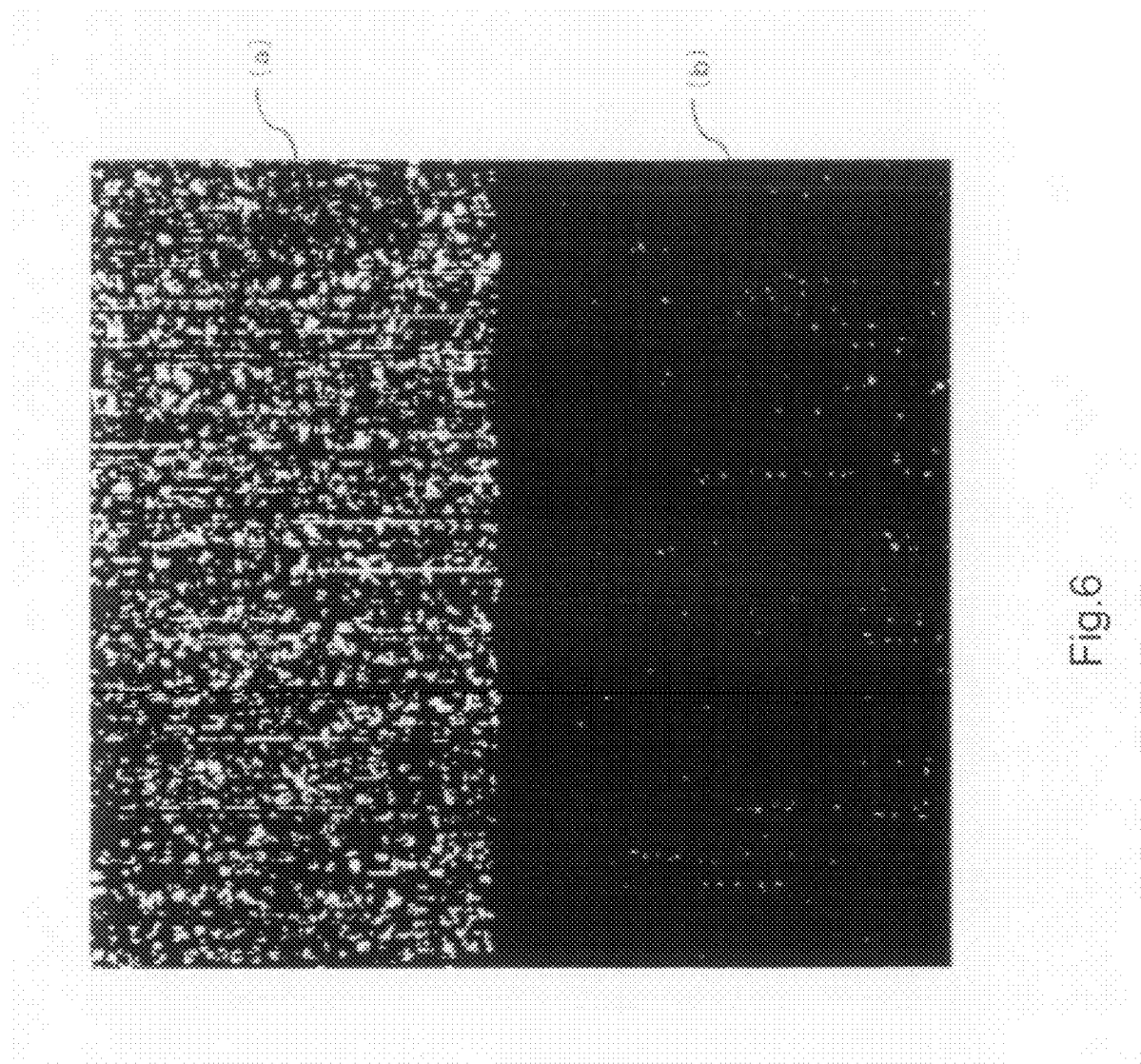
FIGS. 6 (a) and (b) show a substrate to which a black oily dye is applied, in an example of the present invention.

Black oily dye was applied to a surface of a plate made of SUS304, thickness of the plate being 0.2 mm, by a bar coat method so that thickness of the dye was 0.5 μm. Part of the applied surface was dissolved with toluene. The border part of the dissolved part was recorded by a CCD camera. Image conversion of the recorded image to black and white two tones was performed. The result is shown in FIG. 6. In a region of (a), percentage of black pixels was about 47% while, in a region of (b), percentage of black pixels was about 99%. That is, reflection preventing performance was confirmed. A negative photosensitive resin having a main component of polyamide was applied to the surface of this laminated body so that the total thickness was 1.1 mm. Thereafter, a chrome mask (a product of TOKYO PROCESS SERVICE CO., LTD.) having a negative pattern (line width of opening was 106 µm, space of non-opening was 392 µm, was the number of total lines was 64.) corresponding to the above-mentioned substrate to be printed was attached to this printing material in a reduced pressure of 70 mmHg. Thereafter, exposure was performed by using a point UV light source (a product of ORC MANUFACTURING CO., LTD.) After exposure process, through a known development, washing and drying process, a relief printing plate having a convex part in which height was 620 µm, line width thereof was 106 µm and space was 392 µm was manufactured. In addition, for manufacturing an organic EL display, manufacturing plates were respectively performed for red, blue and green.

(Confirming Degree of Accuracy in Detection of a Edge)

The line width of the convex part of the resin plate having the formed reflection controlling layer was measured by using AMIC 1400KY (a product SOKKIA CO., Ltd.). As a result of measurement using a edge detecting method, an average line width of the convex part was 106.1 µm±0.1 µm. That is, the result which was under a desirable accuracy of ±5% or less was obtained. In addition, as for the line width of the convex part, reliability of the measured data was confirmed by performing a cross-check using a scanning electron microscope S-4500 (a product of Hitachi, Ltd.).

(Manufacturing an Organic EL Device)

The above-mentioned high definition relief printing plate was fixed to a single-substrate processing type relief printing apparatus. Printing of each color was performed on a substrate to be printed by using this apparatus and the above-mentioned organic EL device. Organic light emitting layers were printed so that a red organic light emitting layer, a green organic light emitting layer and a blue organic light emitting layer line up in the shape of stripes. After printing of respective colors has performed, the printed matter was dried in an oven at 130° C. for 1 hour. An average film thickness of the formed patterns of respective colors was 102 nm. After the drying, Ca of 10 nm film thickness was formed on the organic EL layer which was formed by the printing. Further, Ag of 300 nm film thickness was formed thereon by a vacuum evaporation. Finally, sealing was performed using a glass cap, thereby an organic EL device of the present invention was manufactured. When a state of light emitting in this organic EL device was confirmed, a special abnormal point such as unevenness in light emitting was not observed.

Comparative Example

Manufacturing a Resin Plate without a Reflection Controlling Layer

A negative type photosensitive resin having a main component of polyamide was applied on a surface of a plate made of SUS304, thickness of the plate being 0.2 mm, so that total thickness was 1.1 mm. Thereafter, a chrome mask (a product of TOKYO PROCESS SERVICE CO., LTD.) having a negative pattern (line width of opening was 106 µm, space of non-opening was 392 µm, was the number of total lines was 64.) corresponding to the above-mentioned substrate to be printed was attached to this printing material in a reduced pressure of 70 mmHg. Thereafter, exposure was performed by using a point UV light source (a product of ORC MANUFACTURING CO., LTD.) After exposure process, through a known development, washing and drying process, a relief printing plate having a convex part in which height was 620 µm, line width thereof was 106 µm and space was 392 µm was manufactured. In addition, for manufacturing an organic EL display, manufacturing plates were respectively performed for red, blue and green.

(Confirming Degree of Accuracy in Detection of a Edge)

The line width of the convex part of the formed resin plate without a reflection controlling layer was measured by using AMIC 1400KY (a product of SOKKIA CO., Ltd.). As a result of measurement using a edge detecting method, an average line width was 126.1 µm±15.5 µm. This result was over a desirable accuracy of 5% or less. In addition, there was not repeatability in the measurement for the plates of red, blue and green, respectively. In addition, when cross-check was performed using a scanning electron microscope S-4500 (a product of Hitachi, Ltd.), it was confirmed that a desirable pattern of about 106 µm was formed.

What is claimed is:

1. A relief printing plate for forming a high-definition pattern by a printing method, comprising:
   a convex part consisting of a photosensitive resin layer, the convex part formed by photolithography method;
   a base material supporting the convex part, the base material being a metal material; and
   a light reflection controlling layer, the light reflection controlling layer having a function of light reflection controlling performance in white light in the wave length range of 400 nm-800 nm, and the layer being between the convex part and the base material,
   wherein a convex pattern of the convex part is not connected to an adjacent convex pattern of the convex part,
   wherein the light reflection controlling layer has an inorganic material as a main component, and
   wherein the thickness of the light reflection controlling layer is 1 nm-1 µm.

2. The relief printing plate according to claim 1, wherein the light reflection controlling layer comprises a light diffusion layer.

3. The relief printing plate according to claim 1, wherein the transmittance of the light reflection controlling layer is equal to or less than 85% in the light wave length of the range.

4. The relief printing plate according to claim 1, wherein the photosensitive resin layer consists of polyamide.

5. A relief printing plate for forming a high-definition pattern by a printing method, comprising:
   a convex part consisting of a photosensitive resin layer, the convex part formed by photolithography method;
   a base material supporting the convex part, the base material being a metal material; and
   a light reflection controlling layer, the light reflection controlling layer having a function of light reflection controlling performance in white light in the wave length range of 400 nm-800 nm, and the layer being between the convex part and the base material,
   wherein a convex pattern of the convex part is not connected to an adjacent convex pattern of the convex part,
   wherein the light reflection controlling layer comprises a light diffusion layer, wherein the transmittance of the light reflection controlling layer is equal to or less than 85% in the light wave length of the range,
   wherein the light reflection controlling layer has an inorganic material as a main component, and
   wherein the thickness of the light reflection controlling layer is 1 nm-1 µm.

* * * * *